(12) United States Patent
Fujii

(10) Patent No.: US 7,820,465 B2
(45) Date of Patent: Oct. 26, 2010

(54) MANUFACTURING METHOD FOR A CIRCUIT PATTERN, A THIN FILM TRANSISTOR AND AN ELECTRONIC APPLIANCE

(75) Inventor: Gen Fujii, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 182 days.

(21) Appl. No.: 11/712,481

(22) Filed: Mar. 1, 2007

(65) Prior Publication Data

US 2007/0207274 A1 Sep. 6, 2007

(30) Foreign Application Priority Data

Mar. 2, 2006 (JP) ............................. 2006-057021

(51) Int. Cl.
*H01L 21/00* (2006.01)
(52) U.S. Cl. .......... 438/30; 257/E21.174; 257/E21.582; 428/432; 428/702
(58) Field of Classification Search .................. 438/30; 257/E21.174, E21.582; 428/432, 702
See application file for complete search history.

(56) References Cited

U.S. PATENT DOCUMENTS

| | | | |
|---|---|---|---|
| 5,696,011 A | 12/1997 | Yamazaki et al. | |
| 5,852,488 A * | 12/1998 | Takemura | 349/187 |
| 6,132,800 A | 10/2000 | Shimada et al. | |
| 6,294,313 B1 | 9/2001 | Kobayashi et al. | |
| 6,337,731 B1 | 1/2002 | Takemura | |
| 6,399,257 B1 | 6/2002 | Shirota et al. | |
| 7,176,069 B2 * | 2/2007 | Yamazaki et al. | 438/149 |
| 7,208,401 B2 * | 4/2007 | Nelson et al. | 438/609 |
| 7,273,773 B2 | 9/2007 | Yamazaki et al. | |
| 7,365,805 B2 | 4/2008 | Maekawa et al. | |
| 2001/0035926 A1 | 11/2001 | Yamaguchi et al. | |
| 2002/0079832 A1 | 6/2002 | Van Tongeren et al. | |
| 2002/0109456 A1 | 8/2002 | Morii et al. | |
| 2002/0132454 A1 * | 9/2002 | Ohtsu et al. | 438/486 |
| 2003/0059686 A1 | 3/2003 | Kobayashi et al. | |
| 2004/0131979 A1 | 7/2004 | Li et al. | |
| 2005/0009327 A1 | 1/2005 | Yoshida et al. | |
| 2005/0196711 A1 | 9/2005 | Shiroguchi et al. | |
| 2005/0202681 A1 * | 9/2005 | Nelson et al. | 438/758 |
| 2005/0221203 A1 | 10/2005 | Fujii | |

(Continued)

FOREIGN PATENT DOCUMENTS

CN 1426606 A 6/2003

(Continued)

*Primary Examiner*—Charles D Garber
*Assistant Examiner*—Stanetta D Isaac
(74) *Attorney, Agent, or Firm*—Nixon Peabody LLP; Jeffrey L. Costellia

(57) ABSTRACT

A circuit pattern is formed by following steps: forming a light-blocking mask over a major surface of a light-transmitting substrate, forming a first film in a first region over the substrate and the mask, forming a photocatalytic film in at least a part of the first region over the first film, changing wettability of the first film in a second region which is in the first region, being in contact with the photocatalytic film, and not overlapping the mask, by light irradiation from a back surface opposite to the major surface of the substrate, removing the photocatalytic film, and forming a composition including a pattern forming material in the second region.

32 Claims, 24 Drawing Sheets

U.S. PATENT DOCUMENTS

| | | | |
|---|---|---|---|
| 2005/0287721 A1 | 12/2005 | Yamamoto et al. | |
| 2006/0121745 A1 | 6/2006 | Fujii | |
| 2006/0134918 A1 | 6/2006 | Fujii et al. | |
| 2006/0158482 A1 | 7/2006 | Nakamura et al. | |
| 2007/0026580 A1* | 2/2007 | Fujii | 438/149 |
| 2007/0093002 A1 | 4/2007 | Maekawa et al. | |
| 2007/0196962 A1 | 8/2007 | Morisue et al. | |
| 2007/0207274 A1 | 9/2007 | Fujii | |
| 2008/0012076 A1 | 1/2008 | Yamazaki et al. | |
| 2008/0105875 A1* | 5/2008 | Maekawa et al. | 257/72 |
| 2008/0199992 A1 | 8/2008 | Maekawa et al. | |

FOREIGN PATENT DOCUMENTS

| | | |
|---|---|---|
| JP | 11-207959 | 8/1999 |
| JP | 11-207959 A | 8/1999 |
| JP | 11-251259 | 9/1999 |
| JP | 2001-272526 A | 10/2001 |
| JP | 2003-059940 | 2/2003 |
| JP | 2003-059940 A | 2/2003 |
| JP | 2005-311325 | 11/2005 |
| JP | 2005-311325 A | 11/2005 |
| WO | WO-02/052660 A1 | 7/2002 |
| WO | WO-2005/077549 A1 | 8/2005 |

* cited by examiner

117

A    C

117

B    D

MANUFACTURING METHOD FOR A CIRCUIT PATTERN, A THIN FILM TRANSISTOR AND AN ELECTRONIC APPLIANCE

BACKGROUND OF THE INVENTION

1. Field of the Invention

The present invention relates to a manufacturing method of a circuit pattern, a thin film transistor (hereinafter, also referred to as a TFT), and an electronic appliance using a droplet discharge method typified by an ink jet method and relates to a manufacturing method of a display device including the thin film transistor. In particular, the present invention relates to a manufacturing method of a circuit pattern such as a wiring, a thin film transistor, and an electronic appliance.

2. Description of the Related Art

In a manufacturing process of a thin film transistor and an electrical circuit including the thin film transistor, various kinds of thin films such as a semiconductor, an insulator, or a conductor are stacked over a substrate. In such a process, photolithography is widely known as a method for forming a pattern. A photolithography is a technique in which a pattern of a circuit or the like, which is called photomask and formed of a material which does not transmit light over a light-transmitting flat surface, is transferred to a predetermined substrate by utilizing light. Photolithography is widely used in a manufacturing process of a semiconductor integrated circuit and the like.

There are two main problems with photolithography. One is that a large amount of resource is consumed. In a conventional manufacturing process of a TFT utilizing photolithography, a number of steps such as light exposure, development, baking, and peeling are required because of a mask pattern called photoresist formed of a photosensitive organic resin material. Therefore, in order to reduce a manufacturing cost in a manufacturing process of a TFT, it is reasonable to take reduction in the number of steps of photolithography into consideration. Further, if it becomes possible to manufacture a TFT without photolithography, significant reduction in the manufacturing cost can be expected.

The other problem has been caused as a size of a mother glass substrate increases. A glass substrate is often used as a substrate for manufacturing a liquid crystal display device, an EL display device, or the like. A mother glass substrate has a size from 300 mm×400 mm of the first generation in the beginning of 1990, to 2160 mm×2400 mm of the eighth generation. A device for the eighth generation is developed and released in 2006. Such increase in size of the substrate generates two main advantages. One is that productivity is significantly improved since a number of panels for a display device can be manufactured with one mother glass substrate. The other is that a large panel can be manufactured. However, a large substrate is difficult to be exposed to light at one time with a light exposure apparatus used for transferring a mask pattern in a photolithography step.

Therefore, as an alternate technique for photolithography, a method of forming a pattern using an ink jet technique is receiving attention. The ink jet technique is originally developed for printing record, since only needed quantity of material can be located on a needed location, application of the ink jet technique to a field relating nanotechnology such as a semiconductor process is considered.

As an approach to nanotechnology, a top-down method and a bottom-up method can be given. The former is a technique in which a minute structure can be manufactured by stacking a material and then etching a desired region thereof. The latter is a technique in which a minute structure can be manufactured by stacking a material in an atom or molecular level. The top-down method has supported the conventional nanotechnology and photolithography is widely used in a manufacturing process of a semiconductor integrated circuit and the like. However, it seems that the limit of the top-down method is being reached. Recently, the bottom-up method draws attention. It can be said that a technology for manufacturing a TFT using an ink jet method is included in the category of the bottom-up method.

As an example of a technique for manufacturing a TFT using an ink jet method, Patent Document 1 can be given (Patent Document 1: Japanese Published Patent Application No. 2005-311325).

SUMMARY OF THE INVENTION

As described above, photolithography, which has been widely used in a conventional manufacturing process of a semiconductor, wastes large amount of materials and is difficult to be applied to a large substrate. Therefore, development of a technique for forming a pattern such as a wiring with use of an ink jet method is carried out. However, in an ink jet method, depending on a size of a discharge outlet of a nozzle from which a droplet is discharged, a scanning capability of the discharge outlet, and the like; it is difficult to precisely control discharge or the like of a pattern forming material. Accordingly, short circuit or a defect in formation of a wiring is caused in some cases, for example. If a method of Patent Document 1 is used, a predetermined pattern can be formed with good controllability because regions having different wettability are formed by back surface exposure which utilizes a substance having a photocatalytic function (hereinafter, referred to as a photocatalytic substance). Further, a high performance display device with high reliability can be manufactured with a high yield and with a reduced waste of materials and reduced cost. However, a film of a photocatalytic substance (hereinafter, referred to as a photocatalytic film) is left between a channel formation region in a semiconductor film and a gate insulating film. Electrical characteristics of this photocatalytic film have an effect on the semiconductor film. For example, if resistance per unit area of the photocatalytic film is smaller than that of the semiconductor film, the photocatalytic film becomes conductive instead of the semiconductor film when a TFT is turned on, which degrades electrical characteristics of the TFT. This becomes more pronounced as electrical resistance per unit area of the photocatalytic film becomes smaller than that of the semiconductor film. In addition, even though it is possible to remove the photocatalytic film in the case of using a method of Patent Document 1, the photocatalytic film under a source electrode or drain electrode layer is not removed. There is a problem that ends of the photocatalytic film is in contact with the semiconductor film and electrical characteristic is degraded.

The present invention provides a technique for reducing the number of steps of photolithography in a manufacturing process of a TFT, an electronic circuit including the TFT, and a display device including the TFT and the electronic circuit. In addition, the present invention provides a technique for manufacturing a TFT having favorable electrical characteristics compared to a conventional one with reduced cost and a high yield.

In the present invention, a TFT is manufactured or a circuit pattern is formed without leaving a photocatalytic film right under a semiconductor film, by modifying a surface of a substance to be treated with use of energy generated by photo activation of the photocatalytic substance and removing the photocatalytic film after a treatment.

The present invention includes a method for forming a circuit pattern, including: forming a light-blocking mask over a major surface (hereinafter, referred to as a surface) of a light-transmitting substrate; forming an insulating layer over the substrate and the mask; forming a first region of a substance including a fluorocarbon chain over the insulating layer; forming a photocatalytic film in a whole or part of the first region; forming a second region by modifying a portion which is in the first region, which is in contact with the photocatalytic film, and which does not overlap the mask by light irradiation from a back surface opposite to the major surface of the light-transmitting substrate; removing the photocatalytic film; and discharging (including ejection, the same applies hereinafter) a composition including a pattern forming material in the second region. Note that the insulating layer is not necessarily provided when it is not required.

The present invention also includes a method for forming a thin film transistor, including: forming a first light-blocking conductive layer over a major surface of a light-transmitting substrate; forming an insulating layer over the substrate and the first conductive layer; forming a first region of a substance including a fluorocarbon chain over the insulating layer; forming a photocatalytic film in a whole or a part of the first region; forming a second region by modifying a portion which is in the first region, which is in contact with the photocatalytic film, and which does not overlap a mask by light irradiation from a back surface of the substrate; removing the photocatalytic film; and forming a second conductive layer by discharging a composition including a conductive material in the second region.

It is preferable that wettability with respect to the composition of the second region is higher than that of the first region in the foregoing manufacturing methods of the circuit pattern or thin film transistor.

It is preferable to use zinc oxide for the photocatalytic film in the foregoing manufacturing methods of the circuit pattern or thin film transistor.

It is preferable to use hexamethyldisilazane or fluoroalkylsilane for the substance including the fluorocarbon chain in the foregoing manufacturing methods of the circuit pattern or thin film transistor.

It is preferable that the irradiating light has a wavelength of 380 nm or less in the foregoing manufacturing methods of the circuit pattern or thin film transistor.

It is preferable that the first conductive layer is a gate electrode layer and the second conductive layer is a source electrode or drain electrode layer in the foregoing manufacturing methods of the thin film transistor.

The thin film transistor manufactured by the forgoing manufacturing methods can be included in an electronic appliance. As such an electronic appliance, a video camera, a digital camera, a projector, a head mounted display, a car navigation system, a car stereo, a personal computer, a game machine, a portable information terminal, or an image reproducing device provided with a recording medium can be given.

Note that in this specification, back surface exposure refers to irradiation of light from a back surface opposing to a front surface of the substrate. Since a light-blocking mask is provided between the substrate which transmits light and a substance to be exposed to light, when back surface exposure is carried out, there is a region which is not exposed to light. Therefore, there is a region which is modified and a region which is not modified. The region which is modified is controlled with accuracy by the light-blocking mask.

Note that in this specification, a transistor refers to an element including at least three terminals of a gate, a drain, and a source, and a channel formation region is included between a drain region and a source region.

Note that in this specification, a display device refers to an active matrix display device typified by an electroluminescence (hereinafter, referred to as EL) display device and a liquid crystal display device, in which light emission and non light emission are controlled by a TFT. An EL display device is a self-light emitting display device which includes a light emitting element having a medium of an organic substance, an inorganic substance, or mixture thereof, which emits light when voltage is applied thereto, between electrodes, and a TFT controlling the light emitting element. A liquid crystal display device is a display device which includes a light emitting device and controls the extent of light transmission with TFTs by utilizing a phenomenon that orientation of liquid crystal molecules is changed by voltage applied to the liquid crystal. Note that in this specification, both an electrode layer and a conductive layer refer a layer formed of a conductive substance and they are not differentiated from each other.

With a manufacturing method of the present invention, a desired pattern can be formed with good controllability. Therefore, a TFT with favorable electrical characteristics can be manufactured with reduced waste of materials and reduced cost. Accordingly, a high performance display device with high reliability can be manufactured with a high yield.

DETAILED DESCRIPTION OF THE INVENTION

Figure 1A:
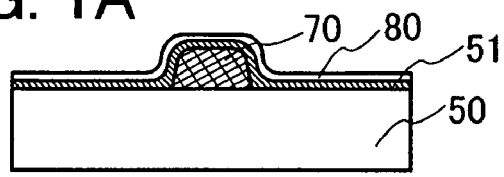
FIGS. 1A to 1D illustrate a manufacturing method of the present invention.
Figure 1A:

Hereinafter, embodiment modes of the present invention are described in detail with reference to the accompanying drawings. Note that the present invention is not limited to the following embodiment modes and can be modified in various ways without departing from the purpose. In addition, in a structure of the present invention described below, like portions or portions having similar functions in the different drawings are denoted by the like reference numeral and repeated description is omitted.

Embodiment Mode 1

An example of an embodiment mode of the present invention is described with reference to FIGS. 1A to 2C.

In the present invention, a method in which one or more of patterns for forming a display device, such as a conductive layer for forming a wiring layer or an electrode, a mask layer for forming a predetermined pattern, and the like can be formed selectively is employed. In accordance with the present invention, a TFT, a display device including the TFT, a television device including the display device, and the like are manufactured. In the present invention, a pattern refers to any component elements in a TFT and a display device including the TFT, formed to have a predetermined shape such as a conductive layer such as a gate electrode layer, a source electrode layer, and a drain electrode layer; a semiconductor layer; a mask layer; an insulating layer; and the like. As a method for selectively forming a pattern, a droplet discharge (ejection) method (also referred to as an ink jet method, depending on its type) is used, in which a predetermined pattern can be formed by selectively discharging a droplet of a compound mixed for a particular purpose. In addition, another method for transferring or drawing a pattern, such as various printing methods (a method of forming a pattern, such as screen (mimeograph) printing, offset (lithography) printing, relief printing, gravure (intaglio) printing, or the like) can also be used.

In this embodiment mode, a pattern is formed by, for example, discharging a composition containing a pattern forming material which is fluid as a droplet. A droplet containing a pattern forming material is discharged to a region where a pattern is to be formed, and then baked, dried, and the liked to be fixed; whereby a pattern is formed.

Figure 22:
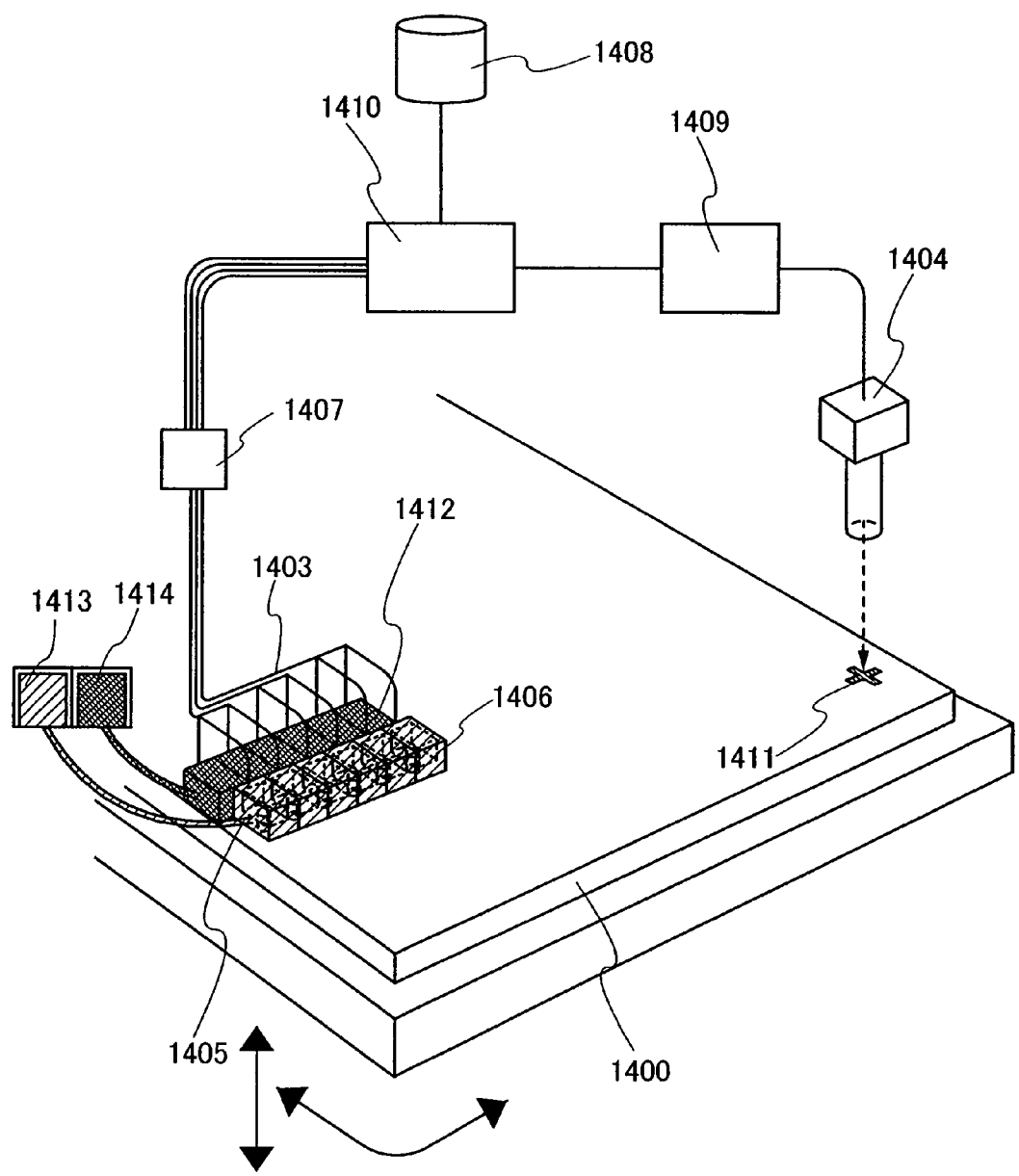
FIG. 22 illustrates a structure of a droplet discharging device which can be applied to the present invention.

An example of a droplet discharging device for forming a pattern is shown in FIG. 22. Each of heads 1405 and 1412 of a droplet discharging device 1403 is connected to a controlling device 1407 which is controlled by a computer 1410, whereby a stored pattern can be drawn. A position for drawing a pattern is determined in accordance with a relative position with reference to a maker 1411 formed on a substrate 1400. The marker 1411 is detected by an imaging device 1404 and the detected data is converted into a digital signal by an image processing device 1409. The computer 1410 recognizes the digital signal and generates a control signal which is sent to the control device 1407. As the imaging device 1404, an image sensor which utilizes a charge coupled device (hereinafter, referred to as CCD), an image sensor which utilizes a complementary metal oxide semiconductor (hereinafter, referred to as CMOS), or the like can be used. Information on a pattern to be formed over the substrate 1400 is stored in a storage medium 1408. A control signal based on the information is sent to the controlling device 1407, so that the heads 1405 and 1412 of the droplet discharging device 1403 can be controlled. A material to be discharged is supplied to the heads 1405 and 1412 through pipes from material supplying sources 1413 and 1414, respectively.

Inside the head 1405, a space as indicated by a dotted line 1406 to be filled with a liquid material and a nozzle which is a discharge outlet are provided. Although not illustrated, the head 1412 has an internal structure similar to the head 1405. A size of a nozzle of the head 1405 is different from that of the head 1412 so that different widths can be drawn with different materials at the same time. Each of the heads can individually discharge a conductive material or the like for drawing. In the case of using a large region such as an interlayer insulating film, the same material is, for example, discharged from a plurality of nozzles at the same time to improve the throughput. In the case of using a large substrate, a region on which drawing is performed can be freely set by the heads 1405 and 1412 moving in a direction shown by arrows. Accordingly, a plurality of the same patterns can be drawn over one substrate.

In a pattern forming method of a source electrode or drain electrode layer or the like using a droplet discharge method, a pattern is formed as follows: a pattern forming material which is processed into particles and is dissolved or dispersed in a solvent is discharged, and welded or fused to be joined by baking to be cured. Accordingly, although a pattern formed by a sputtering method or the like often has a columnar structure, the pattern formed by the droplet discharge method often has a polycrystalline structure having a number of grain boundaries.

As shown in FIGS. 1A to 1D, a region in which a pattern is formed and an adjacent region thereof are irradiated with light to modify a surface selectively, as a pretreatment. Then, the pattern is formed by attaching a composition containing a pattern forming material to the modified surface. The pattern can be formed in a self-alignment manner since back surface exposure is used.

As light used for a modifying treatment, ultraviolet light is used. A lamp light source may light only for a necessary period of time, or may light more than once for irradiation.

Alternatively, laser light may be used for a modifying treatment. A laser oscillator which can emit ultraviolet light and which can emit laser light having a wavelength in a region which can pass a substrate can be used. As a laser oscillator, a XeF excimer laser can be used as an excimer laser oscillator, and a He—Cd gas laser can be used as a gas laser oscillator. Alternatively, a semiconductor laser oscillator such as a ZnS semiconductor laser can be used. In addition, an optical system including a shutter, a reflector such as a mirror or a half mirror, or a cylindrical lens or a convex lens, and the like may be provided in order to adjust a shape of laser light emitted from a laser oscillator and a path of the laser light.

During the light irradiation, a substrate may be moved so as to be exposed to light selectively, or light may scan along a X axis direction and a Y axis direction so that the substrate is exposed to light selectively. In the latter case, an optical system preferably uses a polygon mirror, a galvanometer mirror, or a MEMS (Micro Electro Mechanical System) mirror.

In the present invention, a back surface of the substrate is irradiated with light and wettability of an irradiated region is changed. Thus, regions having different wettability with respect to the composition containing a pattern forming material are formed in a region where a mask is formed and an adjacent region thereof. The difference of the wettability between regions is relative. It is acceptable if the wettability with respect to the composition containing a pattern forming material differs between a region where a pattern is to be formed and a surrounding region thereof, in which the pattern is not formed. Note that the regions having different wettability have different contact angles of the composition containing a pattern forming material. A region having a larger contact angle of the composition containing a pattern forming material is a region having lower wettability (hereinafter, referred to as a lower wettability region). A region having a smaller contact angle of the composition containing a pattern forming material is a region having higher wettability (hereinafter, referred to as a higher wettability region). When a contact angle is large, a liquid composition having fluidity does not spread over the surface of the region and is repelled and the surface is not wetted. On the other hand, when a contact angle is small, a composition having fluidity spreads over the surface and the surface is wetted. Further, the regions having different wettability have different surface energy. The surface energy of the region having lower wettability is low and the surface energy of the region having higher wettability is high. In the present invention, the contact angles between two regions having different wettability differ by 30° or more, preferably, 40° or more. As a method of measuring the contact angle, there are a liquid drop method (such as a tangent method, a θ/2 method, or a three-point click method), a gradient method, a perpendicular plate immersion method, and a downfall method. Here, a tangent method, which is one kind of a liquid drop method, is used. In a tangent method, an angle is measured using a reading microscope trained to a droplet, with a cursor line of the microscope adjusted to a contact of the droplet.

For forming regions having different wettability, light irradiation is carried out. A substance to be treated is formed over the region where a mask is formed and the adjacent region thereof, and a treatment for selectively heightening or lowering wettability is carried out with light. Here, a region having higher wettability is formed by the following manner: a substance having low wettability is formed over a region where a pattern is to be formed and the adjacent region thereof, and then light which decomposes the substance having low wettability irradiates the substance so that the substance having low wettability is decomposed or removed in the region where a pattern is to be formed, accordingly wettability thereof is improved. Therefore, in a region having higher wettability, the concentration or the amount of the substance having low wettability (the concentration or the amount of an alkyl group or a substance including a structure in which hydrogen in an alkyl group is replaced by fluorine, which lowers wettability) is lowered. The substance having low wettability refers to a substance containing a material which has the effect of lowering wettability. When light irradiates the material for lowering wettability, a part of the material is decomposed or damaged, whereby the effect of lowering wettability is reduced or lost. In the foregoing manner, two regions having different wettability are formed.

In order to form the regions having different wettability with good controllability, back surface exposure is used. Here, a mask is formed over a surface of a light-transmitting substrate, an insulating film is formed over the substrate and the mask, and the substance having low wettability is, for example, discharged over the insulating film. Then, back surface exposure is carried out, so that a material for lowering wettability contained in the substance having low wettability, existing in a region which does not overlap the region where the mask is formed is discomposed. Since light does not irradiate the substance having low wettability formed in the region overlapping the region where the mask is formed, the regions having different wettability can be formed with good controllability. A wavelength of light used at this time is acceptable as long as the substance having low wettability is discomposed or removed. However, depending on the substance having low wettability, light having high energy with a wavelength of 200 nm or less is required. Further, if the irradiating light has a wavelength in a range which is absorbed by the light-transmitting substrate, the light is absorbed by the substrate and can not pass therethrough, which means that the light does not reach a substance to be treated and the surface thereof can not be modified. In addition, a number of irradiation may be necessary in order to carry out the treatment sufficiently, so that the cost is increased and productivity is lowered.

In the present invention, a photocatalytic film is formed in contact with the substance to be treated so that treatment efficiency of the light irradiation is improved. Light irradiation refers to irradiation of light having a wavelength in a region which activates the photocatalytic substance. The photocatalytic substance activates by absorbing light. The photocatalytic substance which is activated acts on the surrounding substance to promote reaction, and modifies the surrounding substance. The photocatalytic substance itself does not change since it is a catalyst. With use of the present invention, modifying capability is improved by the photocatalytic substance, which expands the range of choice of wavelength of light. Accordingly, a wavelength in a region which is not absorbed by the substrate over which the substance to be treated is formed can be chosen, so that the surface can be modified with good controllability. Further, since the light use efficiency can also be improved, a treatment can be conducted sufficiently if the light has low energy. Therefore, a device and a process are simplified, which leads to reduction in cost and improvement in productivity.

A method for forming a wiring pattern with good controllability is described with reference to FIGS. 1A to 2C. First, a mask 70 is formed over a light-transmitting substrate 50 (FIG. 1A). A material which is difficult for the emitted light to pass therethrough is used for the mask 70 so that the mask 70 blocks light emitted thereto. Here, a conductive material is used for the mask 70, an insulating material is used for an interlayer film 51, and a conductive material is used for patterns 75a and 75b formed thereover.

Then, a film 80 of a substance having low wettability is formed. For forming the film 80 of a substance having low wettability, a droplet discharge method, a dip coating method of a sol-gel method, a spin coating method, an ion plating method, an ion beam method, a CVD method, a sputtering method, an RF magnetron sputtering method, a plasma splay coating method, a plasma spraying method, an anodization method, or the like can be used. Here, since hexamethyldisilazane (hereinafter, referred to as HMDS) is used, a droplet discharge method or a spin coating method may be preferably used. As the substance having low wettability, fluoroalkylsilane (hereinafter, referred to as FAS) may also be used. It is more preferable that HMDS, FAS, or the like is heated to be vaporized and adsorbed to the substrate exposed to the vapor.

As an example of a composition of a solution for forming the film 80 of a substance having low wettability, a silane coupling agent represented by a chemical formula: $R_n$—Si—$X_{(4-n)}$ (n=1, 2, 3) is used. In this formula, R includes a group which is relatively inactive such as an alkyl group. Further, X includes a hydrolyzable group which can be bonded by condensation with a hydroxyl group or absorbed water on a surface, such as halogen, a methoxy group, an ethoxy group, or an acetoxy group.

By using a fluorine-based silane coupling agent (FAS) having a fluoroalkyl group for R, which is a representative example of the silane coupling agent, the wettability can be lowered. R of FAS has a structure expressed by $(CF_3)(CF_2)_x (CH_2)_y$, (x: an integer of 0 to 10, y: an integer of 0 to 4) in which if a plurality of R are boned to Si, R may all be the same or different from each other. As a representative FAS, heptadecafluorotetrahydrodecyltriethoxysilane, heptadecafluorotetrahydrodecyltrichlorosilane, tridecafluorotetrahydrooctyltrichlorosilane, or trifluoropropyltrimethoxysilane can be given.

As a solvent of the solution for forming the film 80 of a substance having low wettability, a hydrocarbon-based solvent such as n-pentane, n-hexane, n-heptane, n-octane, n-decane, dicyclopentane, benzene, toluene, xylene, durene, indene, tetrahydronaphthalene, decahydronaphthalene, or squalene; tetrahydrofuran; dioxane; ethanol; dimethyl sulfoxide, or the like is used.

As an example of a composition of the solution for forming the film 80 of a substance having low wettability, a fluorine-based resin, which is a substance having a fluorocarbon chain, can be used. As the fluorine-based resin, polytetrafluoroethylene (PTFE: 4-fluorinated ethylene resin), perfluoroalkoxy alkane (PFA: 4-fluorinated ethylene perfluoroalkylvinylether copolymer resin), perfluoroethylenepropene copolymer (PFEP: 4-fluorinated ethylene 6-fluorinated propylene copolymer resin), ethylene-tetrafluoroethylene copolymer (ETFE: 4-fluorinated ethylene-ethylene copolymer resin), polyvinylidene fluoride (PVDF: fluorinated vinylidene resin), polychlorotrifluoroethylene (PCTFE: 3-fluorinated ethylene chloride resin), ethylene-chlorotrifluoroethylene copolymer (ECTFE: 3-fluorinated ethylene chloride-ethylene copolymer resin), polytetrafluoroethylene-perfluorodioxole copolymer (TFE/PDD), polyvinyl fluoride (PVF: fluorinated vinyl resin), or the like can be used.

Alternatively, the lower wettability region may be formed selectively by using an organic material which does not have low wettability with respect to a droplet of the composition for forming a pattern, and then carrying out a treatment with $CF_4$ plasma or the like. For example, a material in which a water-soluble resin such as polyvinyl alcohol (hereinafter, referred to as PVA) is mixed in a solvent such as $H_2O$ can be used. Alternatively, PVA may be used together with another water-soluble resin. Further alternatively, an organic resin material (polyimide or acryl) or a siloxane resin may be used. A siloxane resin refers to a resin including a Si—O—Si bond. Siloxane has a skeleton structure including a bond of silicon (Si) and oxygen (O) and has an organic group which includes at least hydrogen (such as an alkyl group or an aromatic hydrocarbon) as a substituent. As the substituent, a fluoro group may be used, or an organic group including at least hydrogen and a fluoro group may be used. When a material having low wettability is used, the wettability can be further reduced by performing a plasma treatment or the like.

Figure 1B:
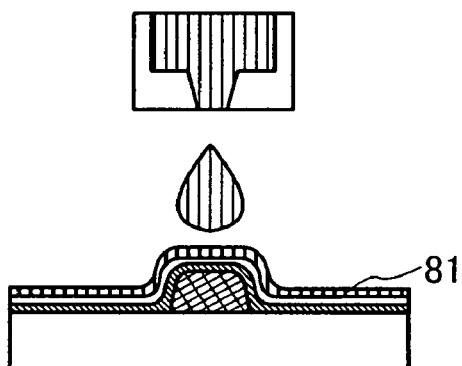
Figure 1B:

Then, a photocatalytic film 81 is formed (FIG. 1B). As the photocatalytic film 81, zinc oxide is used. The photocatalytic film 81 can be activated by irradiating it with light in an ultraviolet light region (wavelength: 380 nm or shorter). A droplet discharge method is used for forming the photocatalytic film. As a composition to be discharged, zinc acetate ink, which is a precursor of zinc oxide, is used. Zinc acetate ink is formed by dissolving zinc acetate dihydrate in water and adding ethylene glycol thereto to heighten the viscosity. Further, surfactant is added thereto to adjust the surface tension. After being discharged, the zinc acetate ink is baked at a predetermined temperature for a predetermined time. Zinc oxide can be formed at a low temperature. Here, a heat treatment is performed at 150° C. for 30 minutes in an oxygen atmosphere.

The crystalline structure of zinc oxide used as the photocatalytic substance is a zinc blende structure or a wurtzite structure. After the baking at 150° C. for 30 minutes described above, the crystalline structure of zinc oxide is an amorphous structure or a polycrystalline structure.

When the photocatalytic substance is heated and reduced in vacuum or under hydrogen flow, an oxygen defect is caused in the crystal. The oxygen defect thus generated serves similarly to an electron donor. In the case of forming the photocatalytic substance by a sol-gel method, the photocatalytic substance is not necessarily reduced since an oxygen defect exists from the beginning. In addition, an oxygen defect can be caused by doping the photocatalytic substance with a gas such as nitrogen ($N_2$).

Figure 1C:
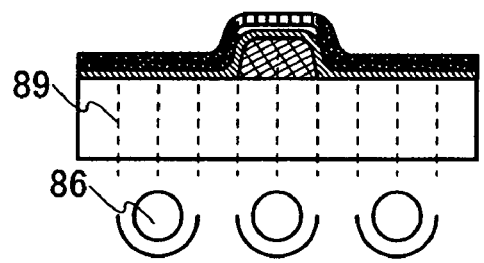
Figure 1C:
Figure 1D:
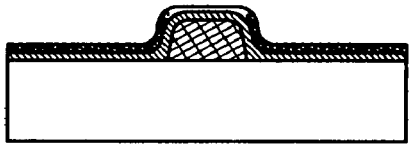
Figure 2A:
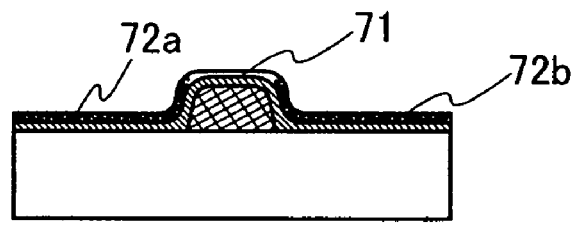
FIGS. 2A to 2C illustrate a manufacturing method of the present invention.

Light 89 emitted from a light source 86 irradiates the photocatalytic film 81 through the substrate 50 (FIG. 1C). The photocatalytic film 81 is activated with the light irradiating the film and energy thereof causes decomposition or damage of the film 80 of a substance having low wettability which is in contact with the photocatalytic film 81, whereby wettability of a treated region is heightened. Since the light 89 is blocked by the mask 70 in a region overlapping a region where the mask 70 is formed, a surface of the substance having low wettability over the mask 70 is not treated. Accordingly, higher wettability regions 72a and 72b which are regions having higher wettability are formed. In other words, regions having different wettability are formed in the region where the mask is formed and the adjacent region thereof (FIG. 2A). Wettability of a region which is not irradiated with light becomes relatively low, whereby a lower wettability region 71 is formed.

Then, the film of zinc oxide serving as the photocatalytic substance is removed by etching. Right under the zinc oxide film, a layer having two regions with different wettability is formed. In order not to damage this layer right under the zinc oxide film, wet etching is preferably used here. Wet etching using hydrochloric acid is used here. Zinc oxide serving as the photocatalytic substance is removed by being soaked in 0.07% of hydrochloric acid for 30 seconds. A chemical solution used here may be an acid solution such as sulfuric acid or nitric acid, or may be an alkaline solution such as ammonia water. It is acceptable as long as a solution can remove zinc oxide serving as the photocatalytic substance and the solution is not likely to damage another layer, and it is not limited to the kinds or concentration of chemical solutions listed above.

Figure 2B:
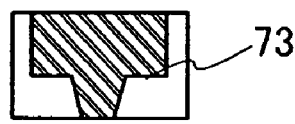
Figure 2B:
Figure 2B:
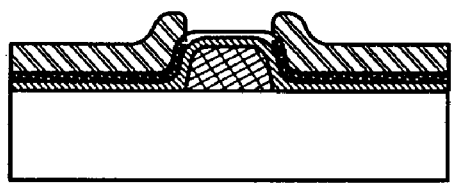
Figure 2C:
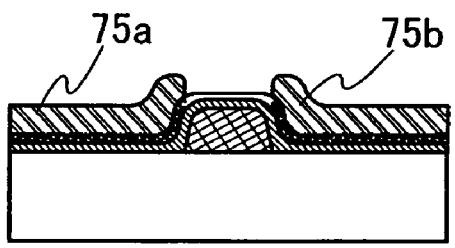

Thereafter, a droplet 74 containing the pattern forming material is discharged to the higher wettability regions 72a and 72b. The droplet 74 is discharged from a nozzle of a droplet discharging device 73. The discharged droplet 74 is attached to the higher wettability regions 72a and 72b (FIG. 2B). Even if the pattern forming material cannot be discharged or the like with precise control depending on the size, the scanning capability, or the like of the discharge outlet of the nozzle from which the droplet is discharged, when the treatment to enhance wettability is carried out in a region where a pattern is to be formed and not in a region where the pattern is not to be formed, the droplet is attached only to the region in which the treatment is carried out, whereby desired patterns 75a and 75b are formed (FIG. 2C).

The pattern is selectively formed as described above because the region where the pattern is to be formed and the surrounding region thereof have different wettability from each other and the droplet is repelled in the lower wettability region and remains in the higher wettability region. In other words, the discharged droplet is repelled by the lower wettability region and moves as if there is a partition wall between the higher wettability region and the lower wettability region. Even if the composition containing a pattern forming material has fluidity, it remains in the higher wettability region; therefore, the pattern can be formed into a desired shape.

With the present invention, in the case of forming a fine pattern such as a source electrode or drain electrode layer, a conductive layer can be formed only in a region where the pattern is to be formed, without a droplet spreading over a region where the pattern is not to be formed even if the size of the discharge outlet is large to a certain degree. Accordingly, a defect such as short circuit that is caused when the droplet is accidentally formed in the region where the pattern is not to be formed can be prevented. Further, the thickness of a wiring can also be controlled. When the surface modification of the substance is carried out by light irradiation from the substrate side as in this embodiment mode, the productivity is improved because a large area can be treated as well as the pattern can be formed with good controllability. In addition, when a droplet discharge method is combined, less material is wasted and the cost can be reduced compared to the method in which the material is applied over the entire surface, such as a spin coating method.

With the present invention, the wirings can be formed with good controllability even if the wiring and the like are dense due to reduction in size and film thickness and are arranged complexly.

In this embodiment mode, although the photocatalytic film and the film of a substance having low wettability are formed as a pretreatment, a thickness of the photocatalytic film may be extremely thin and a film shape is not necessarily kept.

Note that a treatment for heightening wettability is a treatment in which the force for holding a droplet discharged over the region (also referred to as adhesion force or fixing force) is made to be stronger than the surrounding region, which is equivalent to a treatment for enhancing adhesion of the region and the droplet by modifying the region with light irradiation. In addition, only the surface of the region which is in contact and holds the droplet may have the desired wettability, and it is not necessary that the film has the desired wettability in the entire thickness direction.

As described above, with use of the present invention, the desired pattern can be formed with good controllability. In addition, less material is wasted, which leads to reduction in cost. Accordingly, a high performance TFT with high reliability can be manufactured with a high yield.

Embodiment Mode 2

Hereinafter, a manufacturing method of a display device including a TFT manufactured by using the present invention is described with reference to FIGS. 3A to 13C and 15A to 17B. In each FIGS. 3 to 13, A is a top view of a pixel portion (a periphery of a TFT portion) in a display device and B and C are cross-sectional views along lines A-C and B-D in A, respectively.

Figure 3A:
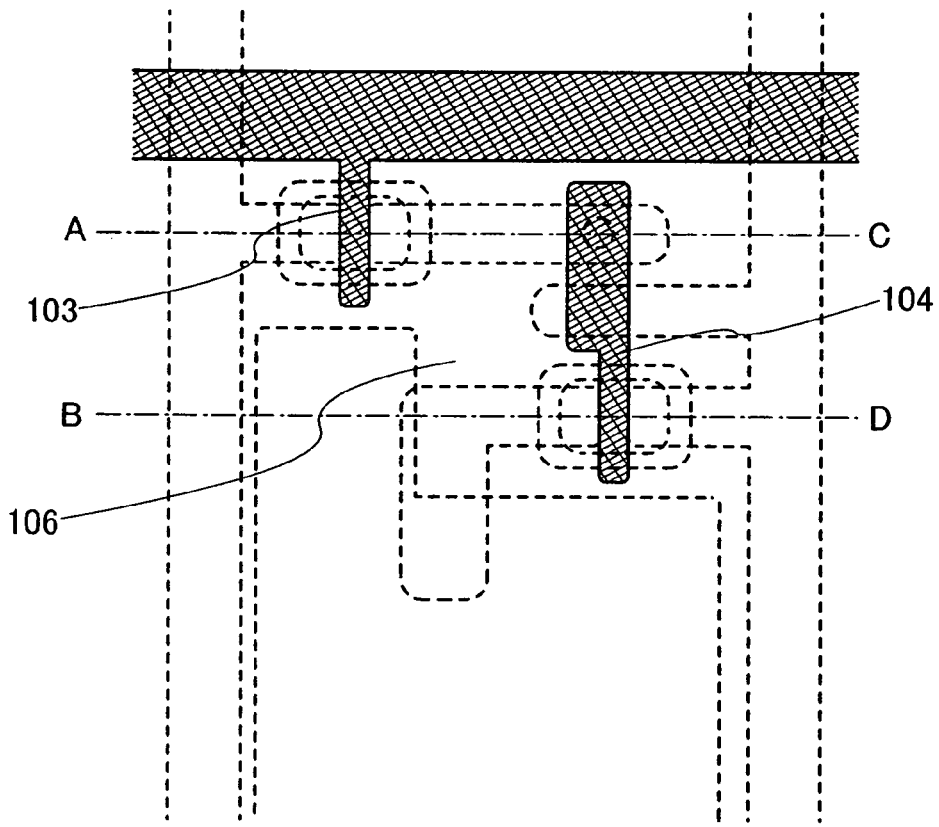
FIGS. 3A to 3C illustrate a manufacturing method of a display device of the present invention.
Figure 3B:
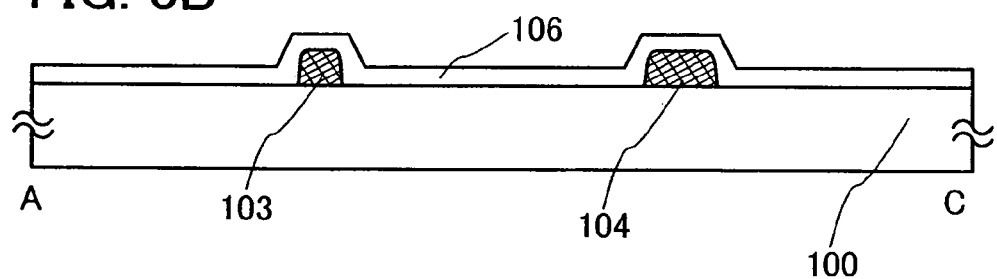
Figure 3C:
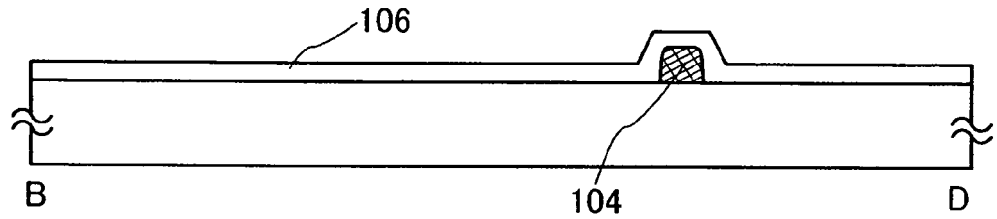

As a light-transmitting substrate 100 in FIGS. 3A to 3C, a glass substrate, a quartz substrate, a silicon substrate, or the like is used. Alternatively, a plastic substrate with heat resistance capable of withstanding a processing temperature of the manufacturing step described later is used. Although not shown, an insulating layer may be formed over the light-transmitting substrate 100 as a base film. The insulating layer is formed by a CVD method, a plasma CVD method, a sputtering method, a spin coating method, or the like. The insulating layer may be a single layer or a stacked layer. Although formation of the insulating layer is not essential, since the insulating layer blocks a contaminant such as sodium (Na) from the light-transmitting substrate 100 if the light-transmitting substrate 100 contains the contaminant, the insulating layer is preferably formed as the base film. In the present invention, a region where a pattern is to be formed is modified. Back surface exposure is used for the modification. Therefore, the light-transmitting substrate is necessarily formed of a substance which transmits light which can modify the region where the pattern is to be formed. In addition, the insulating layer formed as a base film is required to have a light-transmitting property.

Gate electrode layers 103 and 104 are formed over the light-transmitting substrate 100. The gate electrode layer 103 and the gate electrode layer 104 can be formed by a CVD method, a sputtering method, a droplet discharge method, or the like. The gate electrode layer 103 and the gate electrode layer 104 can be formed of an element selected from tantalum (Ta), tungsten (W), titanium (Ti), molybdenum (Mo), aluminium (Al) or copper (C), or an alloy material or a compound material containing such an element as a main component. In the case of using aluminium (Al) for the gate electrode layer 103 and the gate electrode layer 104, hillocks are suppressed by using an Al—Ta alloy in which aluminium is alloyed with tantalum (Ta) added thereto. In addition, in the case of using an Al—Nd alloy in which aluminium is alloyed with neodymium (Nd) added thereto, a wiring with low resistance can be formed as well as hillocks are suppressed. Alternatively, a semiconductor film typified by a polycrystalline silicon film doped with an impurity element such as phosphorus (P) or an AgPdCu alloy may be used. The gate electrode layer may be a single layer or a stacked layer. For example, a two-layer structure including a titanium nitride film and a molybdenum film, or a three-layer structure including a tungsten film having a thickness of 50 nm, an alloy film of aluminium and silicon having a thickness of 500 nm, and a titanium nitride film having a film thickness of 30 nm may be used. In the case of using the three-layer structure, tungsten nitride may be used instead of tungsten for a first conductive film, an alloy film of aluminium and titanium may be used instead of the alloy film of aluminium and silicon for a second conductive film, and a titanium film may be used instead of the titanium nitride film for a third conductive film.

If shapes of the gate electrode layers 103 and 104 are necessarily controlled, a mask may be formed and dry etching may be carried out. The gate electrode layer can be etched into a tapered shape by using an ICP (Inductively Coupled Plasma) etching method and appropriately adjusting an etching condition (such as the amount of electric power applied to a coiled electrode, the amount of electric power applied to an electrode on a substrate side, or an electrode temperature on the substrate side). When a gate electrode layer having a tapered shape is formed, coverage of a gate insulating film formed over a gate electrode is improved. Note that as an etching gas, a chlorine-based gas such as $Cl_2$, $BCl_3$, $SiCl_4$, $CCl_4$, or the like; a fluorine-based gas typified by $CF_4$, $SF_6$, $NF_3$, or the like; or $O_2$ can be appropriately used.

The mask for forming a pattern can be formed by selectively discharging a composition. A process of forming the pattern is simplified by thus forming a mask selectively. A resin material such as an epoxy resin, an acrylic resin, a phenol resin, a novolac resin, a melamine resin, or a urethane resin is used for the mask. Alternatively, the mask is formed with use of an organic material such as benzocyclobutene, parylene, fluorinated arylene ether, or light-transmitting polyimide; a compound material formed by the polymerization of a siloxane-based polymer or the like; a composition material containing a water-soluble homopolymer and a water-soluble copolymer; or the like by a droplet discharge method. Further alternatively, a commercial resist material containing a photosensitizer may be used, and a positive resist or a negative resist may be used. The surface tension and the viscosity of any material can be controlled by adjusting the concentration of a solvent or by adding a surfactant or the like.

Here, an example in which the gate electrode layers 103 and 104 are formed by a droplet discharging device is shown. A droplet discharging device is a generic term for a device provided with a unit for discharging a droplet, such as a nozzle having a discharge outlet of a composition or a head having one or a plurality of nozzles. A diameter of a nozzle in a droplet discharging device is set to be 0.02 to 100 μm, preferably 30 μm or less, and the amount of composition discharged from the nozzle is set to be 0.001 to 100 pl, preferably 0.1 to 40 pl, more preferably 10 pl or less. The discharged amount is increased in proportion to the diameter of the nozzle. The distance between a surface to be treated and the discharge outlet of the nozzle needs to be as short as possible in order to drop the droplet in a desired location, and the distance is preferably set to be 0.1 to 3 mm, more preferably, 1 mm or less.

As the composition discharged from the discharge outlet, a solution in which a conductive material dissolved or dispersed in a solvent is used. A conductive material refers to a metal such as silver (Ag), gold (Au), copper (Cu), nickel (Ni), platinum (Pt), palladium (Pd), iridium (Ir), rhodium (Rh), tungsten (W), or aluminium (Al); fine particles or dispersant nanoparticles of silver halide; indium tin oxide (hereinafter, referred to as ITO), indium zinc oxide (hereinafter, referred to as IZO) or indium zinc oxide containing silicon oxide (hereinafter, referred to as ITSO) used as a light-transmitting conductive film; organic indium; organic tin; organic zinc; titanium nitride; or the like. Note that as the composition discharged from the discharge outlet, in consideration of a specific resistance value, a solution in which any one of gold, silver, or copper is dissolved or dispersed in a solvent is preferably used, in particular, silver or copper, which has low resistance, is more preferably used. When using silver or copper, a barrier film is preferably provided as a measure against an impurity. As the barrier film, a silicon nitride film, nickel boron, or an organic resin such as polyimide can be used.

Alternatively, as the conductive material, a particle having plural layers in which a conductive material is coated with another conductive material may be used. For example, a particle having a three-layer structure in which copper is coated with nickel boron, and the nickel boron is coated with silver may be used. As the solvent, an ester such as butyl acetate and ethyl acetate, an alcohol such as isopropyl alcohol or ethyl alcohol, or an organic solvent such as methyl ethyl ketone and acetone is used. The viscosity of the composition is preferably set to be 20 mPa·s or less so that the composition is prevented from drying and the composition is smoothly discharged from the discharge outlet. The surface tension of the composition is preferably set to be 40 mN/m or less. Note that the viscosity or the like of the composition may be adjusted for a solvent to be used and an intended purpose. For example, the viscosity of a composition in which ITO, organic indium, and organic tin are dissolved or dispersed in a solvent, the viscosity of a composition in which silver or gold is dissolved or dispersed in a solvent may preferably be set to be 5 to 20 mPa·s.

In addition, the conductive layer for forming an electrode may be formed of stacked layers including a plurality of conductive materials. Alternatively, the conductive layer may be formed with use of silver as a conductive material by a droplet discharge method and then the conductive layer for forming an electrode may be plated with copper or the like. The plating may be carried out by electroplating or chemical plating method, in which an electric field is not used. The plating may be carried out by soaking a surface of the substrate in a container filled with a solution containing a material for plating.

The diameter of the conductive particle is preferably as small as possible in order to prevent clogging of the nozzle and to manufacture a highly precise pattern, particularly, the diameter of 0.1 μm or less is preferable, although it is depends on the diameter of nozzles and a shape of a desired pattern. The composition is formed by a method such as an electrolyzing method, an atomizing method, or a wet reducing method, and the diameter of the particle is approximately 0.01 to 10 μm in general. However, when the composition is formed by a deposition method in a gas, a nanoparticle protected with a dispersing agent is minute and has a diameter of approximately 7 nm. Further, when the nanoparticles are covered with a coating material, the nanoparticles are not aggregated in a solvent and are uniformly dispersed in a room temperature and show a property similar to that of liquid. Therefore, it is preferable that the coating material be used.

In the present invention, a pattern is processed into a desired shape because of the difference in wettability with respect to the fluid composition between a region where the pattern is to be formed and the region where the pattern is not to be formed. Therefore, it is necessary that the composition have fluidity even after it attaches the region where the composition is to be formed. A step of discharging the composition may be carried out under reduced pressure as long as the fluidity of the composition is not lost. After discharging the composition, either or both steps of drying and baking are performed. Both drying and baking are heating treatments. Drying is carried out for 3 minutes at 100° C. and baking is carried out for 15 to 60 minutes at 200 to 350° C., for example. Since their purposes are different from each other, the temperatures and the time thereof are different. Drying and baking are performed under normal pressure or reduced pressure utilizing laser light irradiation, rapid thermal annealing (RTA), a heating furnace, or the like. Note that timing of the heat treatment is not particularly limited. With this step, volatilization of the solvent in the composition or chemical removal of the dispersant are carried out and nanoparticles are made in contact with each other, so that fusion and welding are accelerated by hardening and shrinking a peripheral resin.

For the laser light irradiation, a continuous wave or pulsed gas laser may be used. As a gas laser, an excimer laser, a YAG laser, or the like can be given. Note that a continuous wave laser is preferably used in consideration of absorptance of laser light. Alternatively, a so-called hybrid laser irradiation method, in which pulsed and continuous wave lasers are combined, may be used. Note that a heating treatment by laser light irradiation is preferably carried out instantaneously within several microseconds to several tens of seconds so as not to damage the substrate 100, depending on heat resistance of the substrate 100. Rapid thermal annealing (RTA) is carried out by raising the temperature rapidly and heating instantaneously within several microseconds to several minutes using an infrared lamp or a halogen lamp which emits ultraviolet light to infrared light in an inert gas atmosphere. Since this treatment is carried out instantaneously, only an outermost thin film is substantially heated and a film formed thereunder is not affected. In other words, heat can be added even if a substrate having low heat resistance such as a plastic substrate is used.

Then, a gate insulating layer 106 is formed over the gate electrode layers 103 and 104 (FIG. 3B). The gate insulating layer 106 needs to have a light-transmitting property so that light passes therethrough during back surface exposure for activating the photocatalytic substance. Further, the gate insulating layer 106 needs to adsorb a liquid-repellent film which is a substance to be treated. As a material which satisfies such conditions, an oxide material of silicon, a nitride material of silicon, an oxynitride material of silicon, siloxane, or organosiloxane can be given. The gate insulating layer 106 may have a single-layer or a stacked-layer structure. In the case of forming a stacked-layer structure, a surface in contact with the liquid-repellent film needs to satisfy the foregoing conditions. For example, a stacked-layer structure including an organic resin and organosiloxane sequentially from the substrate side may be used. Here, a single-layer of a gate insulating film is formed of organosiloxane by a spin coating method or a droplet discharge method.

Then, as a pretreatment for forming a source electrode or drain electrode layer with good controllability, a region where the pattern is formed and an adjacent region thereof are modified. Here, a substance having low wettability is formed and a photocatalytic film is formed to be in contact therewith. Then, the wettability is changed selectively with use of photo activation of the photocatalytic substance by light irradiation, so that a higher wettability region and a lower wettability region are formed. The difference of wettability between two regions can be checked with contact angles. The contact angles are measured by using a tangent method which is one of a liquid drop method. The contact angles preferably differ by 30° or more, preferably 40° or more, at this time. In the present invention, in order to improve light use efficiency, the photocatalytic film, which is activated by wavelength of the irradiated light, is formed to be in contact with the substance to be treated.

Figure 4A:
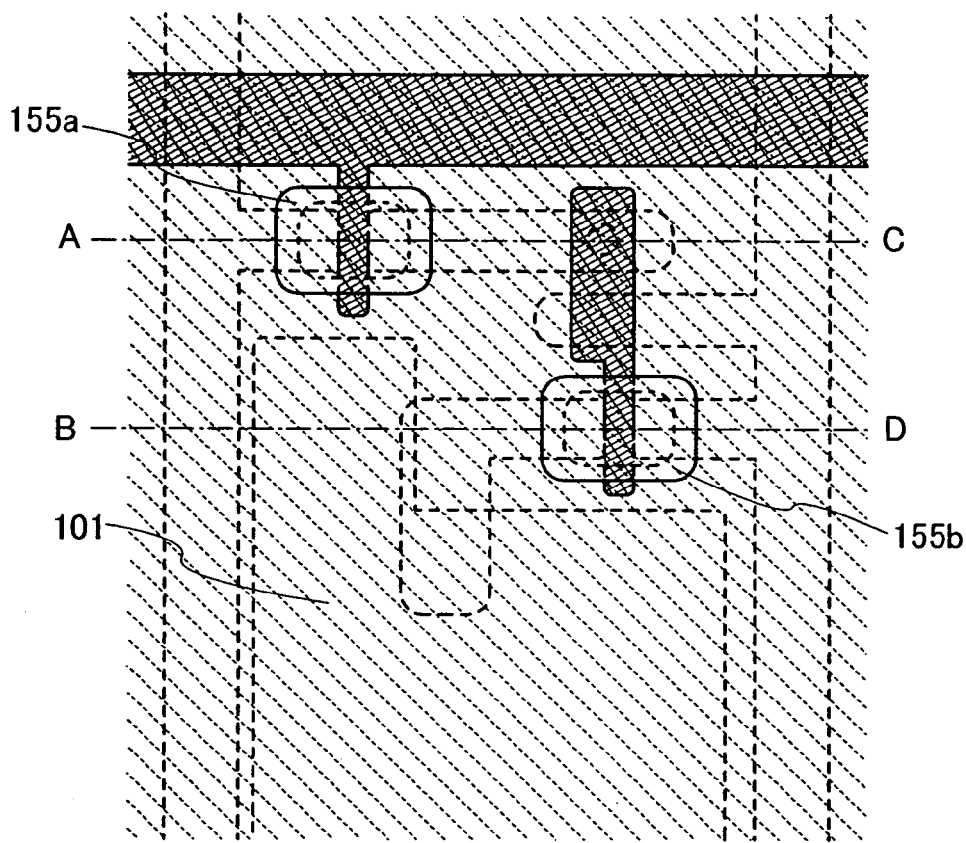
FIGS. 4A to 4C illustrate a manufacturing method of a display device of the present invention.
Figure 4B:
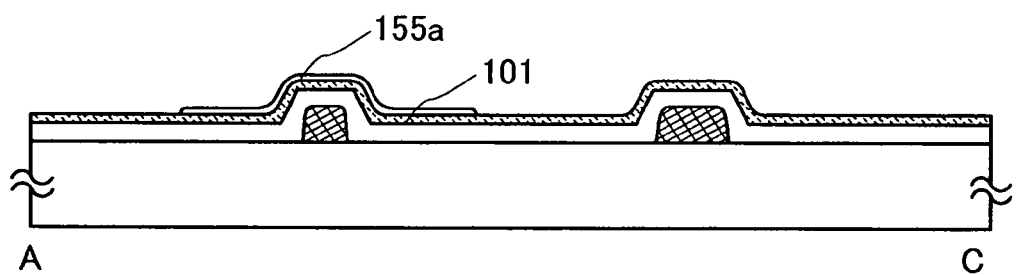
Figure 4C:
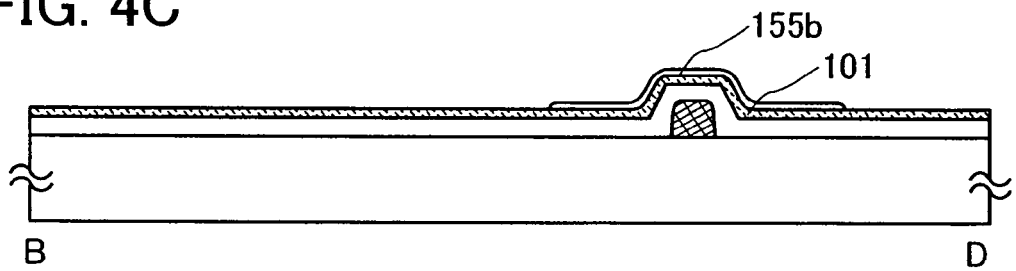

A film 101 of a substance having low wettability is formed over the gate insulating layer 106 and photocatalytic films 155a and 155b are formed over the film 101 of a substance having low wettability (FIGS. 4A to 4C). The film 101 of a substance having low wettability needs to have a light-transmitting property so that light passes therethrough during back surface exposure for activating the photocatalytic substance.

As an example of a composition of a solution for forming the film 101 of a substance having low wettability, a silane coupling agent represented by a chemical formula: $R_n$—Si—$X_{(4-n)}$ (n=1, 2, 3) is used. In this formula, R includes a group which is relatively inactive such as an alkyl group. Further, X includes a hydrolyzable group which can be bonded by condensation with a hydroxyl group or absorbed water on a surface, such as halogen, a methoxy group, an ethoxy group, or an acetoxy group.

By using a fluorine-based silane coupling agent (FAS) having a fluoroalkyl group for R, which is a representative example of the silane coupling agent, the wettability can be lowered. R of FAS has a structure expressed by $(CF_3)(CF_2)_x(CH_2)_y$ (x: an integer of 0 to 10, y: an integer of 0 to 4) in which if a plurality of R are bonded to Si, R may all be the same or different from each other. As a representative FAS, heptadecafluorotetrahydrodecyltriethoxysilane, heptadecafluorotetrahydrodecyltrichlorosilane, tridecafluorotetrahydrooctyltrichlorosilane, or trifluoropropyltrimethoxysitane can be given.

As a solvent of the solution for forming the film 101 of a substance having low wettability, a hydrocarbon-based solvent such as n-pentane, n-hexane, n-heptane, n-octane, n-decane, dicyclopentane, benzene, toluene, xylene, durene, indene, tetrahydronaphthalene, decahydronaphthalene, or squalene; tetrahydrofuran; dioxane; ethanol; dimethyl sulfoxide, or the like is used.

As an example of a composition of the solution for forming the film 101 of a substance having low wettability, a fluorine-based resin, which is a substance having a fluorocarbon chain, can be used. As the fluorine-based resin, polytetrafluoroethylene (PTFE: 4-fluorinated ethylene resin), perfluoroalkoxy alkane (PFA: 4-fluorinated ethylene perfluoroalkylvinylether copolymer resin), perfluoroethylenepropene copolymer (PFEP: 4-fluorinated ethylene 6-fluorinated propylene copolymer resin), ethylene-tetrafluoroethylene copolymer (ETFE: 4-fluorinated ethylene-ethylene copolymer resin), polyvinylidene fluoride (PVDF: fluorinated vinylidene resin), polychlorotrifluoroethylene (PCTFE: 3-fluorinated ethylene chloride resin), ethylene-chlorotrifluoroethylene copolymer (ECTFE: 3-fluorinated ethylene chloride-ethylene copolymer resin), polytetrafluoroethylene-perfluorodioxole copolymer (TFE/PDD), polyvinyl fluoride (PVF: fluorinated vinyl resin), or the like can be used.

Alternatively, the lower wettability region may be formed selectively by using an organic material which does not have low wettability with respect to a droplet of the composition, and then carrying out a treatment with $CF_4$ plasma or the like. For example, a material in which a water-soluble resin such as PVA is mixed in a solvent such as $H_2O$ can be used. Alternatively, PVA may be used together with another water-soluble resin. Further alternatively, an organic resin material (polyimide or acryl) or a siloxane resin may be used.

In this embodiment mode, HMDS is used as the substance having low wettability. Here, wettability refers to the wettability with respect to the composition containing a conductive material for forming the source electrode or the drain electrode layer formed in a later step. Light irradiating HMDS passes the glass substrate so that back surface exposure is carried out. The glass substrate absorbs light with a wavelength of 300 nm or less, the light irradiating HMDS has a wavelength more than 300 nm. Note that in following Embodiment 1, light having a wavelength more than 300 nm irradiates HMDS, and HMDS is hardly decomposed. In the present invention, a zinc oxide layer which shows photocatalytic effect when irradiated with light having a wavelength of 380 nm or less is formed. As a light source, a metal halide lamp, which is an ultraviolet lamp and can emit light with a wavelength of 200 to 450 nm is used. Although the substance having low wettability is selectively formed in a region where the pattern is formed and an adjacent region thereof by a droplet discharge method or the like here, the pattern may be formed with application of the substance over a large area (such as application over the entire surface) by a spin coating method or the like. A droplet discharge method is preferably used since the amount of material which is wasted can be reduced, which can improve the material use efficiency and reduce the cost.

As the photocatalytic substance, zinc oxide is used. The photocatalytic substance can be activated by irradiating the photocatalytic substance with light in an ultraviolet light region (wavelength: 380 nm or shorter). A droplet discharge method is used for forming the photocatalytic film. As a composition to be discharged, zinc acetate ink, which is a precursor of zinc oxide, is used. Zinc acetate ink is formed by dissolving zinc acetate dihydrate in water and adding ethylene glycol thereto to heighten the viscosity. The surface tension of zinc acetate ink is adjusted using a surfactant. After being discharged, the zinc acetate ink is baked at a predetermined temperature for a predetermined time. Zinc oxide can be formed at a low temperature and may be heated at 150° C. for 30 minutes in an oxygen atmosphere.

Figure 5A:
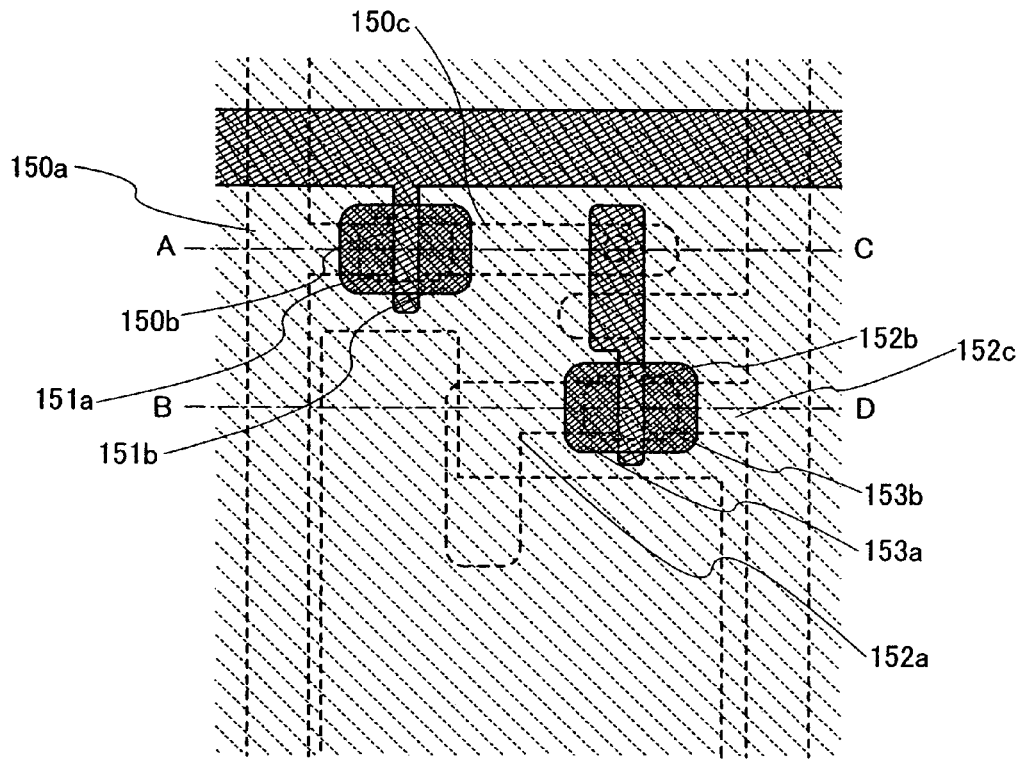
FIGS. 5A to 5C illustrate a manufacturing method of a display device of the present invention.
Figure 5B:
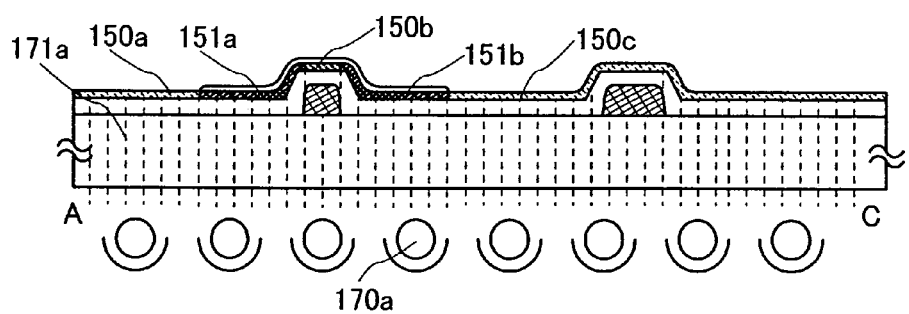
Figure 5C:
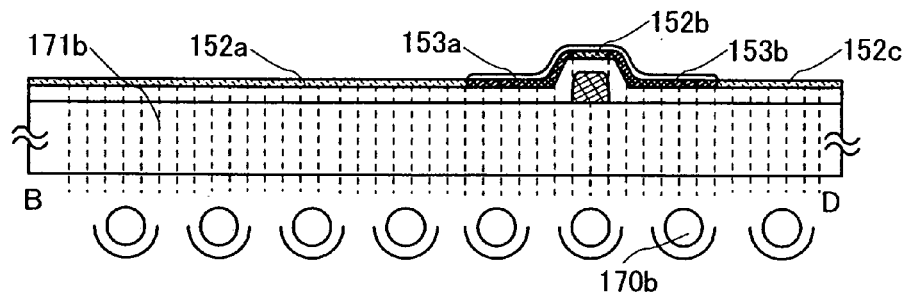

Then, the photocatalytic films 155a and 155b are irradiated with light 171a and 171b emitted by light sources 170a and 170b through the light-transmitting substrate 100 from a back surface opposite to the major surface of the light-transmitting substrate 100 (FIGS. 5A to 5C). The light 171a and 171b activate the photocatalytic films 155a and 155b. Energy generated by the activation causes decomposition of the film 101 of a substance having low wettability, thereby heightening the wettability. The treatment efficiency is improved with use of the photocatalytic effect of the photocatalytic substance. The gate electrode layers 103 and 104 serve as masks; therefore, a region overlapping with the region where the gate electrode layers 103 and 104 are formed, in other words, the masked region, is not irradiated with light. Accordingly, a surface of the substance having low wettability formed in this region is not modified.

When irradiation of the light 171a is carried out, on a surface of the film 101 of a substance having low wettability, higher wettability regions 151a and 151b, which have relatively high wettability; and lower wettability regions 150a, 150b, and 150c, which have relatively low wettability, are formed. Similarly, when irradiation of the light 171b is carried out, on the surface of the film 101 of a substance having low wettability, higher wettability regions 153a and 153b, which have relatively high wettability; and lower wettability regions 152a, 152b, and 152c, which have relatively low wettability, are formed. Since the photocatalytic film is provided, light having a wavelength which is difficult to be absorbed by a material through which the light passes can be selected; therefore, light irradiation for a surface modifying treatment with good controllability which is so-called back surface exposure can be carried out. In addition, irradiation efficiency of light is also improved, a treatment can be conducted sufficiently even if the light has low energy. Therefore, a device and a process are simplified, whereby the cost can be reduced, as a result, the productivity can be improved.

In addition, in the present invention, in the case of forming the gate electrode layer serving as a mask by a droplet discharge method, a treatment may be carried out so that wettability differs between the region where the mask is formed and the region where the mask is not formed, as a pretreatment. In the present invention, in the case of forming a pattern by a droplet discharge method in which a droplet is, for example, discharged with formation of a higher wettability region and a lower wettability region in the region where the pattern is to be formed and the adjacent region thereof, respectively, a shape of the pattern can be controlled. With this treatment, difference of wettability is generated, so that the droplet remains only in the higher wettability region and the pattern can be formed with good controllability. This step is applicable to a pretreatment for forming any pattern of a liquid material.

Figure 6A:
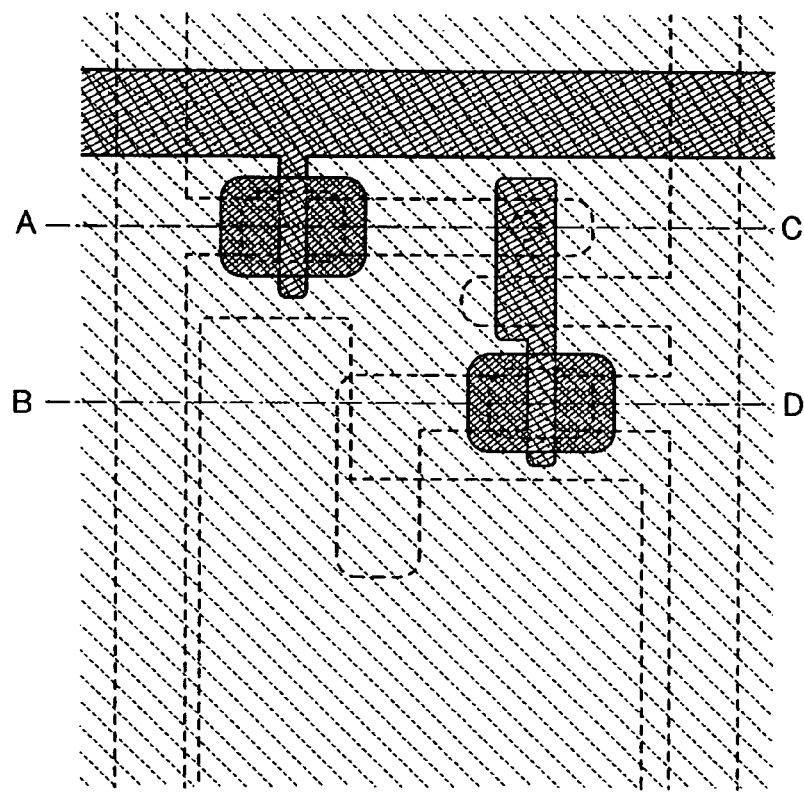
FIGS. 6A to 6C illustrate a manufacturing method of a display device of the present invention.
Figure 6B:
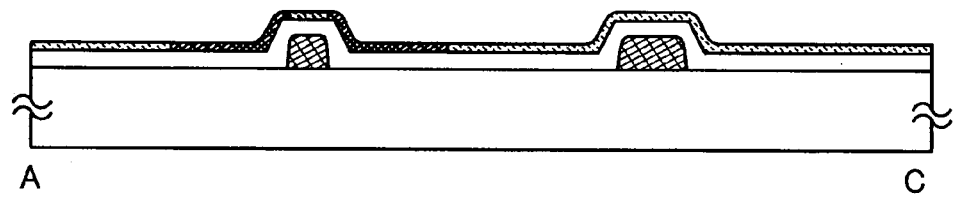
Figure 6C:
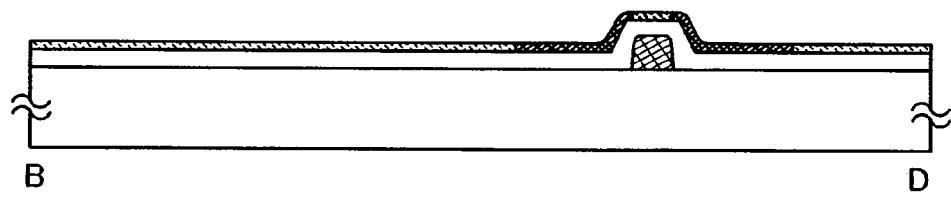

Then, the film of zinc oxide serving as the photocatalytic substance is removed by etching (FIGS. 6A to 6C). Right under the zinc oxide film, two regions with different wettability are formed. Therefore, an etching method in which damage to this layer right under the zinc oxide film is reduced and the two regions with different wettability are not affected is selected. Wet etching using hydrochloric acid is used here.

For example, the film of zinc oxide which is the photocatalytic substance is removed by being soaked in a hydrochloric acid of 0.07% density, for 30 seconds. A chemical solution used here may be an acid solution such as sulfuric acid or nitric acid, or may be an alkaline solution such as ammonia water. It is acceptable as long as a solution can remove zinc oxide which is the photocatalytic substance and the solution is not likely to damage another layer, and it is not limited to the kinds or concentration of chemical solutions listed above.

Figure 7A:
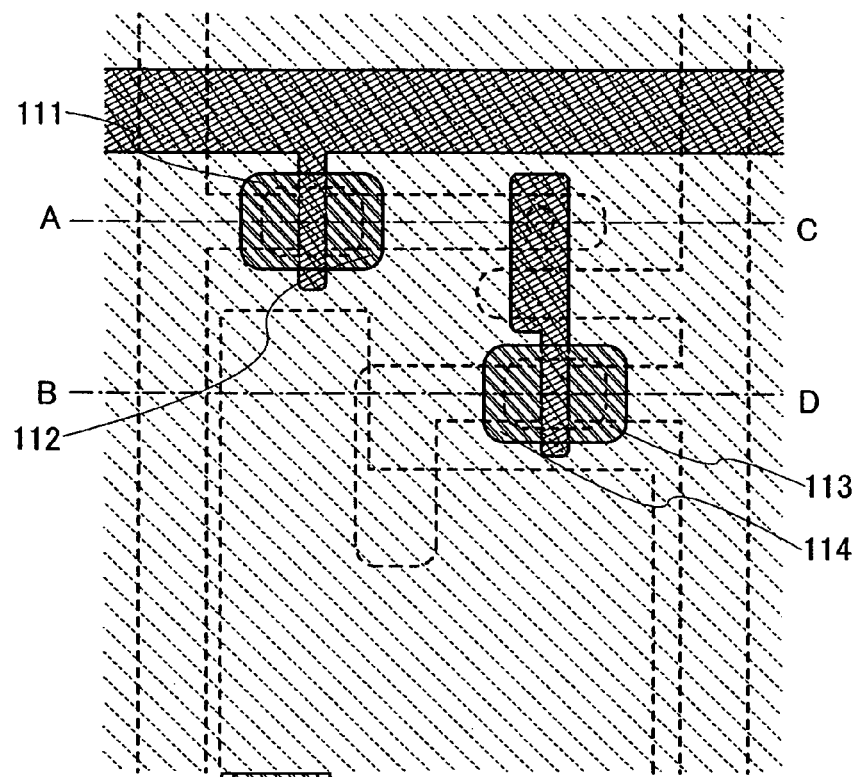
FIGS. 7A to 7C illustrate a manufacturing method of a display device of the present invention.
Figure 7B:
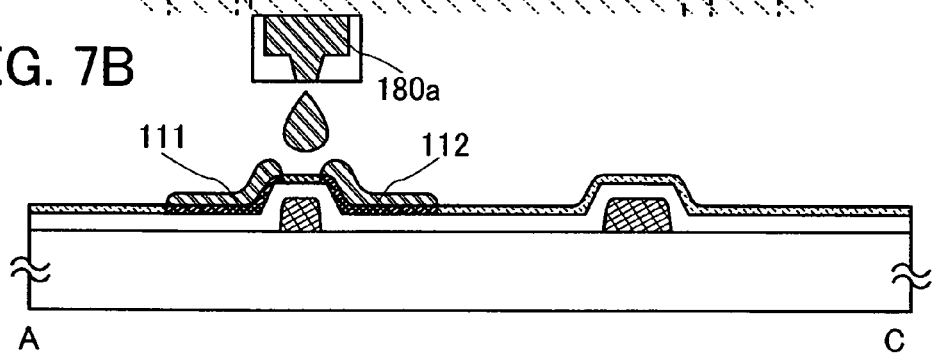
Figure 7C:
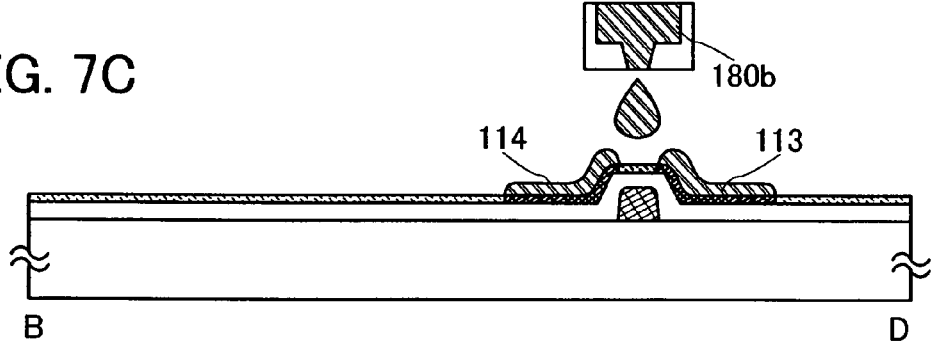

A composition containing a conductive material is discharged in the higher wettability regions 151a and 151b with use of a droplet discharging device 180a to form source electrode or drain electrode layers 111 and 112, and a composition containing a conductive material is discharged in the higher wettability regions 153a and 153b, with use of a droplet discharging device 180b to form source electrode or drain electrode layers 113 and 114 (FIGS. 7A to 7C). Even if a discharging method of the pattern forming material cannot be controlled precisely depending on the size, the scanning capability, or the like of the discharge outlet of the nozzle from which the droplet is discharged, since the treatment to enhance wettability is carried out in a region where the pattern is to be formed, the droplet is attached only to the region where the pattern is to be formed, whereby the desired pattern is formed. This is because the region where the pattern is to be formed and the surrounding region thereof have different wettability from each other, and the droplet is repelled in the lower wettability region and remains in the higher wettability region. In other words, the droplet is repelled by the lower wettability region and moves as if there is a partition wall between the higher wettability region and the lower wettability region. Therefore, even if the composition containing a pattern forming material has fluidity, it remains in the higher wettability region, so that the pattern can be formed into a desired shape.

Figure 8A:
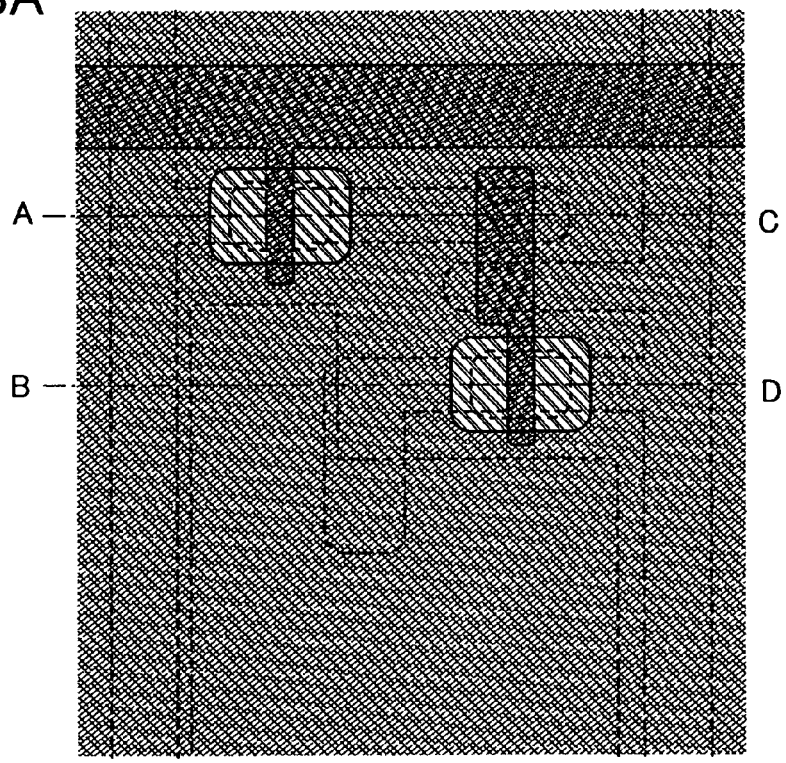
FIGS. 8A to 8C illustrate a manufacturing method of a display device of the present invention.
Figure 8B:
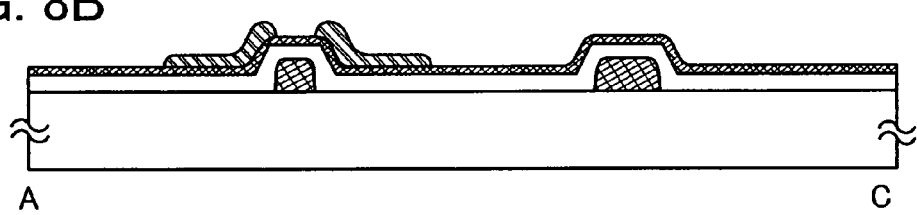
Figure 8C:
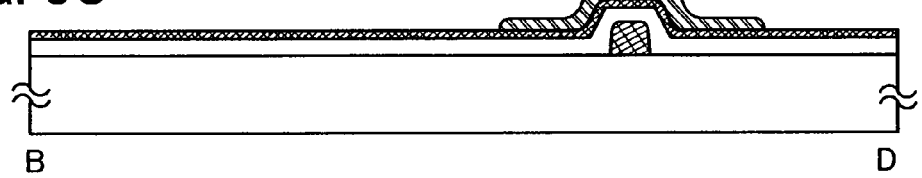

Then, a component which lowers wettability in the film 101 of a substance having low wettability in the lower wettability regions 150 and 152 is removed to form a higher wettability region. The component which lowers wettability in the film of a substance having low wettability may be removed with use of a UV ozone apparatus or by ashing with oxygen. A UV ozone apparatus refers to an apparatus in which light having a wavelength of an ultraviolet region irradiates an organic material to cut the coupling thereof in an atmosphere or an oxygen atmosphere, and the cut organic material and ozone ($O_3$) or the like which is generated by the light irradiation can react with each other With this treatment, a component which lowers wettability in the film of a substance having low wettability can be removed (FIGS. 8A to 8C).

Note that the lower wettability region 150 includes the lower wettability regions 150a, 150b, and 150c. The lower wettability region 152 includes the lower wettability regions 152a, 152b, and 152c.

Subsequently, a mask is formed of an insulator such as a resist or polyimide by a droplet discharge method. A through hole 145 is formed in a part of the gate insulating layer 106 by etching with use of the mask so as to partially expose the gate electrode layer 104 located thereunder. Although the etching may be carried out by either dry etching (plasma etching) or wet etching, dry etching is preferable when the diameter of the through hole needs to be small. As a gas used for dry etching, a fluorine-based or chlorine-based gas such as $CF_4$, $NF_3$, $Cl_2$, or $BCl_3$ may be used. A fluorine-based gas is preferable. $CF_4$ is widely used in general. $H_2$ or $O_2$ may be added thereto, alternatively, an inert gas such as He or Ar may be appropriately added as required.

As for etching of organosiloxane, $CF_4$ to which $O_2$ is added or $SF_6$ may be used. If CF4 is used for etching of organosiloxane, C becomes excessive and the etching rate is lowered. Accordingly, $CF_4$ to which $O_2$ is added is preferably used in etching of organosiloxane.

Figure 9A:
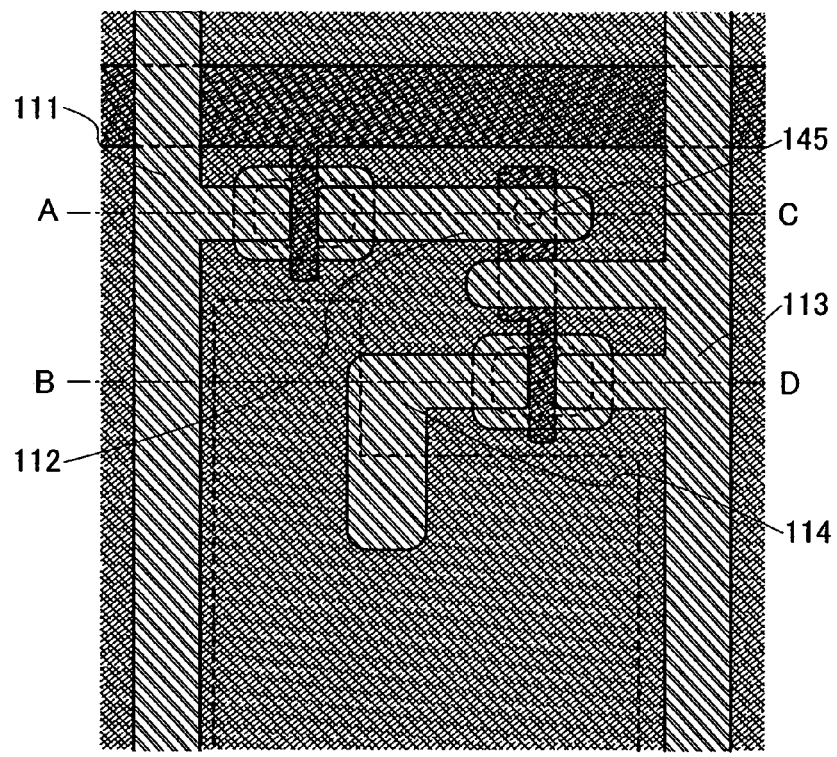
FIGS. 9A to 9C illustrate a manufacturing method of a display device of the present invention.
Figure 9B:
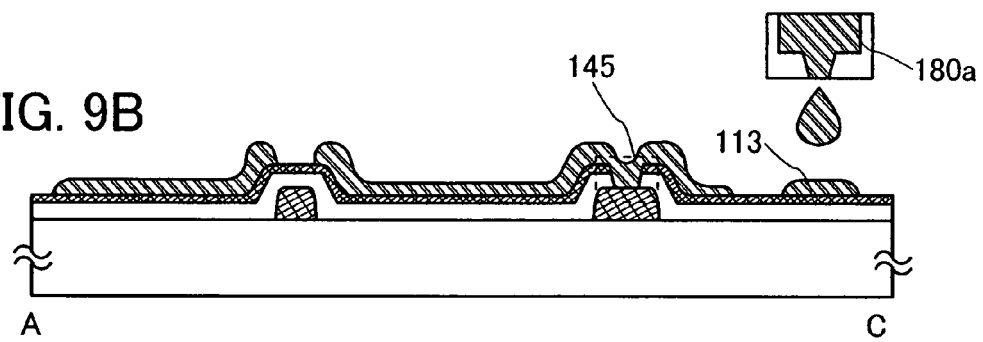
Figure 9C:
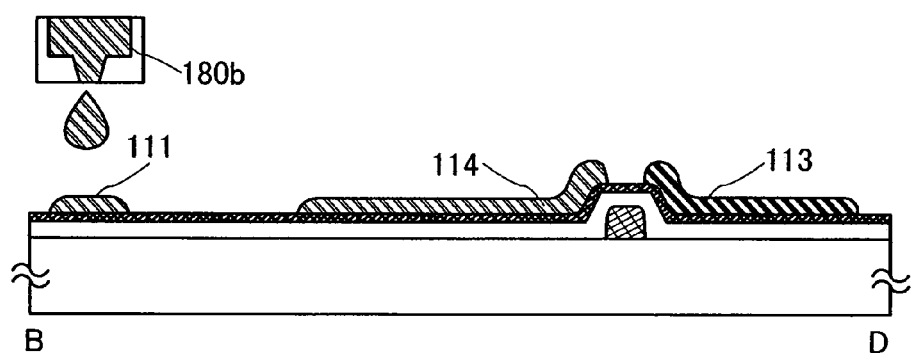

Then, a composition containing a conductive material is discharged to a region in which the source electrode or drain electrode layer to be formed and in which the source electrode or drain electrode layer has not been formed in the foregoing steps, by the droplet discharging devices 180a and 180b, thereby forming the source electrode or drain electrode layers 111, 112, 113, and 114 (FIGS. 9A to 9C).

The source electrode or drain electrode layer 111 also serves as a source wiring layer. The source electrode or drain electrode layer 113 also serves as a power supply line.

A process of forming the source electrode or drain electrode layers 111, 112, 113, and 114 can be carried out similarly to the foregoing process of forming the gate electrode layers 103 and 104.

As a conductive material for forming the source electrode or drain electrode layers 111, 112, 113, and 114, a composition containing particles of a metal element such as silver (Ag), gold (Au), copper (Cu), tungsten (W), or aluminium (Al) as a main component can be used. Alternatively, light-transmitting ITO or ISO, organic indium, organic tin, organic zinc, titanium nitride, or the like may be combined to be used.

The source electrode or drain electrode layer 112 and the gate electrode layer 104 are electrically connected through the through hole 145 formed in the gate insulating layer 106. A part of the source electrode or drain electrode layer forms a capacitor.

With the present invention, in the case of forming a fine pattern such as a conductive layer for forming an electrode, the conductive layer for forming an electrode can be formed only in the region where the pattern is to be formed, without a droplet spreading over the region where the pattern is not to be formed even if the size of the discharge outlet is large to a certain degree. Accordingly, a defect such as short circuit that is caused when the droplet is accidentally formed in the region where the pattern is not to be formed can be prevented. Further, the thickness of the wiring can also be controlled. When the surface modification of the substance is carried out by back surface exposure as in the present invention, the productivity is improved because a large area can be treated as well as the pattern can be formed with good controllability. In addition, when a droplet discharge method is combined, less material is wasted and the cost can be reduced compared to the method in which the material is applied over the entire surface, such as a spin coating method. With the present invention, the wirings can be formed with good controllability even if the wiring and the like are dense due to reduction in size and film thickness and are arranged complexly.

In addition, an organic material substance which serves as an adhesive agent may be formed over the gate insulating layer 106 to enhance adhesion to the pattern formed by a droplet discharge method. In this case, a treatment for forming regions having different wettability over the substance serving as an adhesive agent may be carried out. An organic material such as polyimide or acrylic, or a siloxane resin may be used for the adhesive agent.

Then, octadecyltrimethoxysilane (hereinafter, referred to as ODS) is formed as a base film as required over a region where a channel formation region is to be formed. With formation of ODS, crystallinity can be improved when using a low molecular organic semiconductor (such as anthracene or pentacene) as a semiconductor layer, and a TFT with favorable electrical characteristics can be manufactured. ODS can be formed by a droplet discharge method or a spin coating method, similarly to HMDS. More preferably, ODS is vaporized and adsorbed to the substrate exposed to the vapor.

Figure 10A:
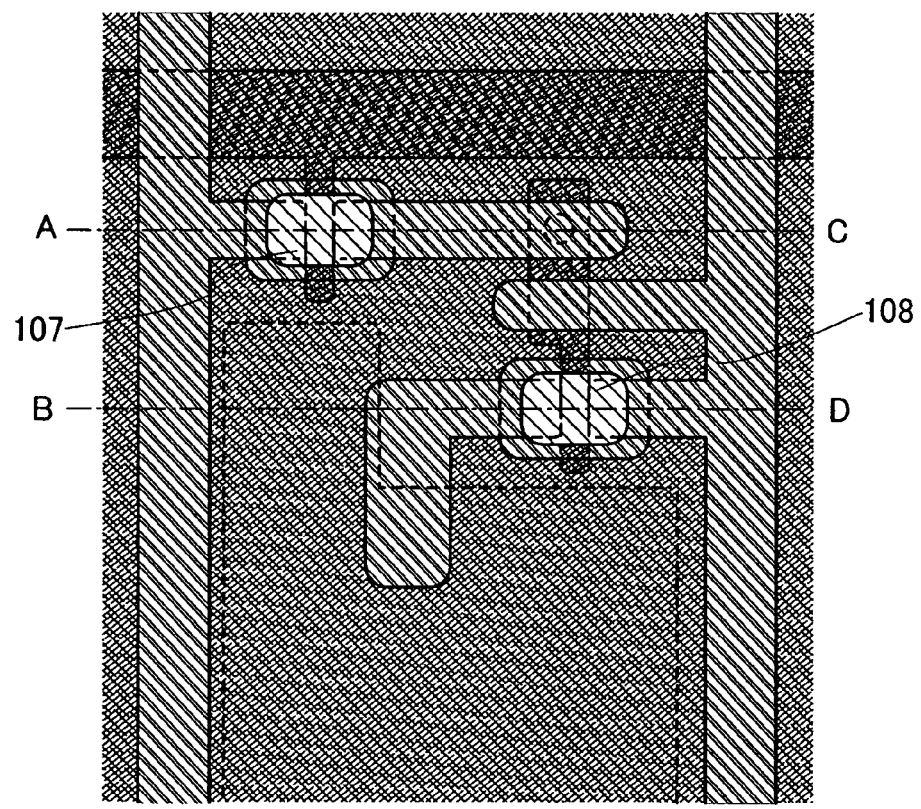
FIGS. 10A to 10C illustrate a manufacturing method of a display device of the present invention.
Figure 10B:
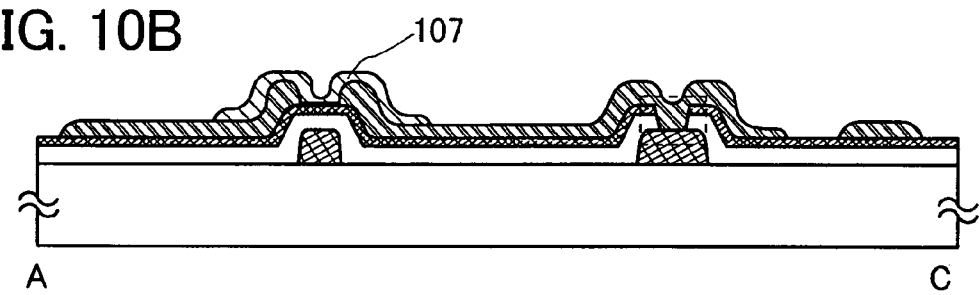
Figure 10C:
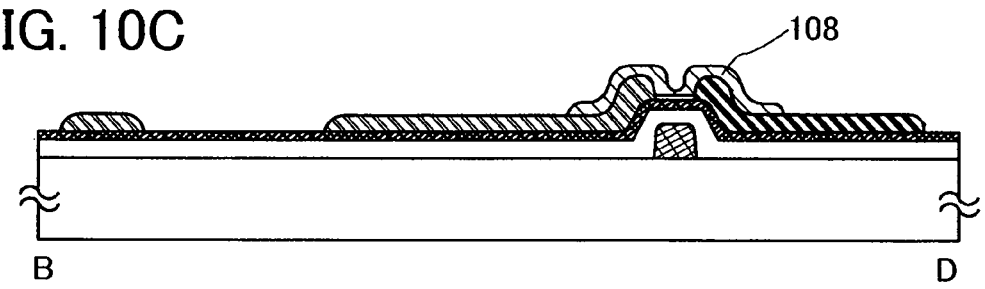

Then, the semiconductor layer is formed (FIGS. 10A to 10C). An organic semiconductor material can be formed by a printing method, a spraying method, a spin coating method, a droplet discharge method, a vacuum vapor deposition method, or the like. An organic semiconductor includes a low molecular material and a high molecular material, and an organic pigment, a conductive high molecular material, or the like can also be used. As an organic semiconductor material used in the present invention, anthracene, pentacene, or the like can be given as a low molecular material; and polythiophene, polyfluorene, poly(3-alkylthiophene), a polythiophene derivative, or the like can be given as a high molecular material.

Alternatively, as an organic semiconductor material which can also be used for the present invention, there is a material with which a first semiconductor region can be formed by performing a treatment after depositing a soluble precursor. As such an organic semiconductor material, polythienylene vinylene, poly(2,5-thienylene vinylene), polyacetylene, a polyacetylene derivative, polyarylene vinylene, and the like can be given.

When conversion of the precursor into an organic semiconductor is carried out, a reactive catalyst such as hydrochloric gas is added thereto, in addition to carrying out a heating treatment. As a representative solvent for dissolving such a soluble organic semiconductor material, toluene, xylene, chlorobenzene, dichlorobenzene, anisole, chloroform, dichloromethane, γ butyl lactone, butyl cellsolve, cyclohexane, NMP (N-methyl-2-pyrrolidone), cyclohexanone, 2-butanone, dioxane, dimethylformamide (DMF), THF (tetrahydrofuran), or the like can be applied.

Here, pentacene is used for semiconductor layers 107 and 108. A vacuum vapor deposition method is used for forming pentacene. A pattern is formed similarly to the gate electrode. That is, a formation of a mask and an ICP etching method is carried out. A resin material such as an epoxy resin, an acrylic resin, a phenol resin, a novolac resin, a melamine resin, or a urethane resin is used for the mask. In addition, the mask is formed by a droplet discharge method with use of an organic material such as benzocyclobutene, parylene, fluorinated arylene ether, or light-transmitting polyimide; a compound material formed by the polymerization of a siloxane-based polymer or the like; a composition material containing a water-soluble homopolymer and a water-soluble copolymer; or the like. Further alternatively, a commercial resist material containing a photosensitizer may be used, and a positive resist or a negative resist may be used. The surface tension and the viscosity of any material can be controlled by adjusting the concentration of a solvent or by adding a surfactant or the like. Since pentacene tends to deteriorate in an organic solvent, PVA or polyvinylpyrrolidone, which is a water-soluble resin, is preferably used as a solvent.

Figure 11A:
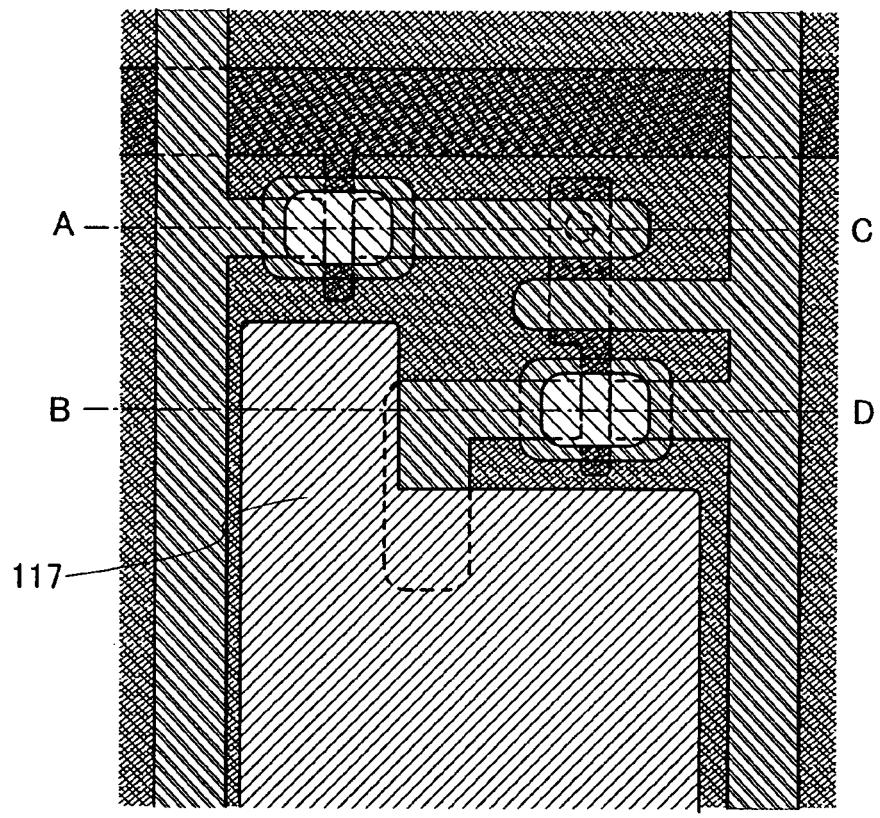
FIGS. 11A to 11C illustrate a manufacturing method of a display device of the present invention.
Figure 11B:
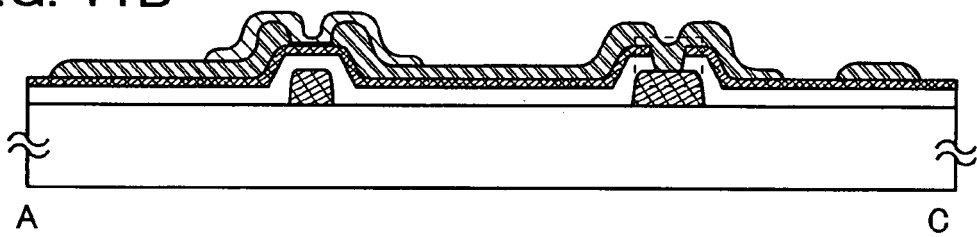
Figure 11C:
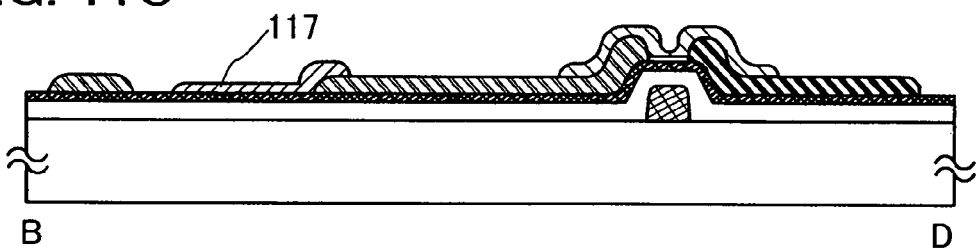

Subsequently, a first electrode layer 117 for applying an electric field to an electroluminescent layer is formed over the gate insulating layer 106 by, for example, selectively discharging a composition containing a conductive material (FIGS. 11A to 11C). When the first electrode layer 117 is formed, a pretreatment for forming a lower wettability region and a higher wettability region may be carried out. The first electrode layer 117 can be selectively formed with good controllability by, for example, discharging the composition containing a conductive material in the higher wettability region. In the case of emitting light from a back surface opposite to the major surface of the light-transmitting substrate 100 or the case of manufacturing a transmissive display panel, the first electrode layer 117 may be formed by forming a predetermined pattern using a composition containing ITO, ITSO containing silicon oxide, IZO containing zinc oxide, zinc oxide, zinc oxide doped with gallium (Ga), tin oxide, or the like; and baking.

The first electrode layer 117 is preferably formed of ITO, zinc oxide, or the like by a sputtering method. More preferably, the first electrode layer 117 is formed of ITSO by a sputtering method with use of a target in which silicon oxide is contained in ITO at 2 to 10%. Alternatively, a conductive material in which zinc oxide is doped with gallium (Ga), or IZO, which is an oxide conductive material in which zinc oxide is mixed in indium oxide at 2 to 20%, containing silicon oxide, may be used. After forming the first electrode layer 117 by a sputtering method, a mask may be formed over the first electrode layer by a droplet discharge method and then, the first electrode layer may be formed into a desired pattern by etching. Here, the first electrode layer 117 is formed of a light-transmitting conductive material by a droplet discharge method. Specifically, the first electrode layer 117 is formed of ITO, ITSO, or the like.

It is also possible to selectively form the first electrode layer 117 over the gate insulating layer 106 before formation of the source electrode or drain electrode layer 114. In this case, a stacked-layer structure of the source electrode or drain electrode layer 114 and the first electrode layer 117 is reversed and the source electrode or drain electrode layer 114 is formed over and in contact with the first electrode layer 117. When the first electrode layer 117 is formed before the formation of the source electrode or drain electrode layer 114, the first electrode layer 117 can be formed in a flat region; therefore, the film having favorable coverage can be formed and the defect in formation of the first electrode layer is rarely generated.

Alternatively, a structure in which an interlayer insulating layer is formed over the source electrode or drain electrode layer 114 and the source electrode or drain electrode layer 114 and the first electrode layer 117 are electrically connected to each other through a wiring layer may be employed. In this case, the formed interlayer insulating layer may be removed in an opening portion (a contact hole). It is preferable that a substance having low wettability with respect to the interlayer insulating layer is formed over the source electrode or drain electrode layer 114 and a composition for forming an insulating layer is formed by, for example, a spin coating method to form the insulating layer in a region where the substance having low wettability is not formed.

Note that in the case of manufacturing a reflective EL display panel with a structure in which emitted light is extracted to an opposite side of the light-transmitting substrate 100 side (a top emission structure), a composition containing metal particles of silver (Ag), gold (Au), copper (Cu), tungsten (W), aluminium (Al), or the like as a main component can be used. Alternatively, the first electrode layer 117 may be formed by forming a light-transmitting conductive film or a light-reflective conductive film by a sputtering method, forming a mask by a droplet discharge method, and carrying out an etching treatment.

The first electrode layer 117 may be wiped and polished with a PVA-based porous body or by a CMP method so that the surface thereof is flattened. Furthermore, ultraviolet irradiation, an oxygen plasma treatment, or the like may be performed on the surface of the first electrode layer 117 after polishing by a CMP method.

Note that the present invention is not limited to the foregoing method. For example, the photocatalytic film may be formed in the whole region where the source electrode or drain electrode layer is to be formed. In this method, since a portion in which the gate electrode layer and the region where the source electrode or drain electrode layer is to be formed are overlapped is not exposed to light by back surface exposure, the portion is a lower wettability region right after removing the photocatalytic film. Therefore, the source electrode or drain electrode layer is not formed if a composition is for example, discharged. Accordingly, it is necessary that a droplet is, for example, selectively discharged in a region overlapping the gate electrode layer, in the region where the source electrode or drain electrode layer is to be formed.

With the foregoing process, a substrate for a display panel having a structure in which a bottom gate TFT and a pixel electrode are connected to each other over the light-transmitting substrate 100 is completed. Note that the TFT is a co-planar TFT. With use of the present invention, a TFT can be manufactured in a self-alignment manner.

Figure 12A:
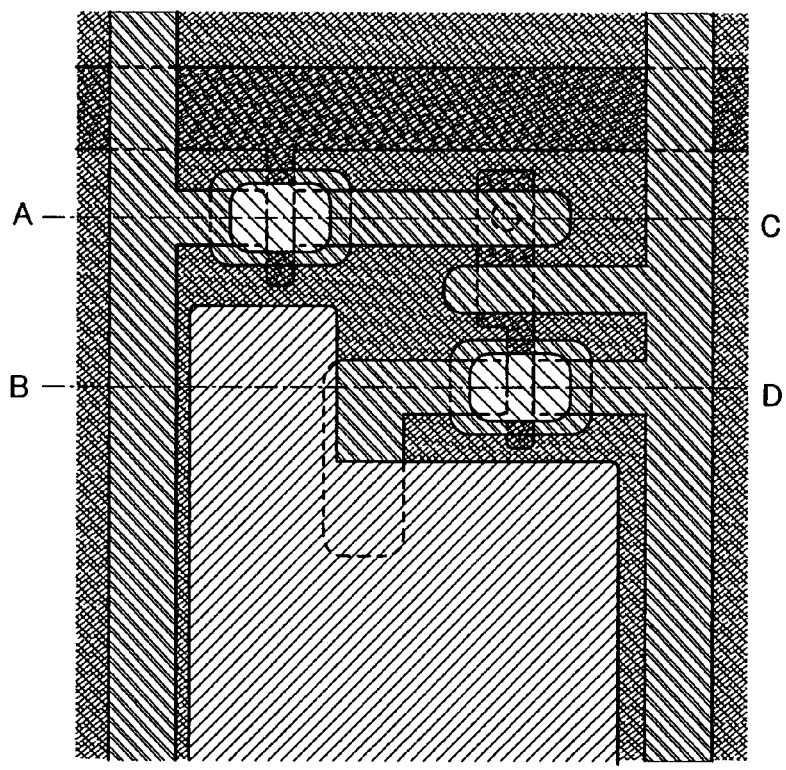
FIGS. 12A to 12C illustrate a manufacturing method of a display device of the present invention.
Figure 12B:
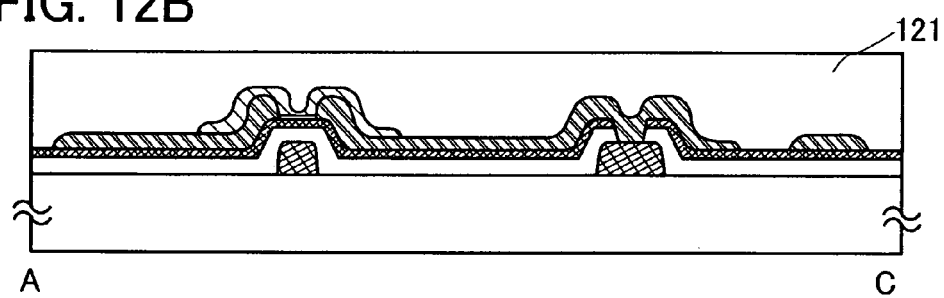
Figure 12C:
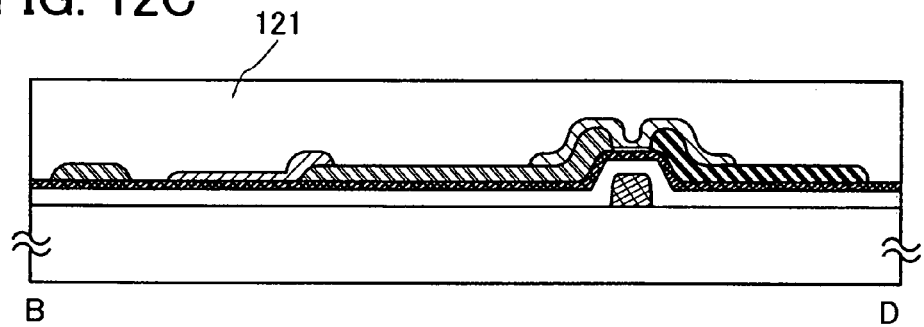

Subsequently, an insulating layer 121 is selectively formed (FIGS. 12A to 12C). The insulating layer 121 is formed over the first electrode layer 117 to have an opening portion. That is, a pattern is formed by forming the insulating layer 121 over the entire surface and etching the insulating layer 121 using a mask. The formation of the pattern by etching is not always necessary if the insulating layer 121 is formed by using a droplet discharge method or a printing method in which the insulating layer 121 can be selectively formed directly. Further, the insulating layer 121 can be formed into a desired shape by a pretreatment of the present invention.

The insulating layer 121 can be formed with use of an inorganic insulating material such as silicon oxide, silicon nitride, silicon oxynitride, silicon nitride oxide, aluminium oxide, aluminium nitride, or aluminium oxynitride; acrylic acid, methacrylic acid, or a derivative thereof; a heat-resistant polymer such as polyimide, aromatic polyamide; or polybenzimidazole; or a siloxane resin. When the insulating layer 121 has a shape with a continuously changed curvature radius, coverage of an electroluminescent layer 122 and a second electrode layer 123 formed over the insulating layer 121 is improved.

In addition, after forming the insulating layer 121, for example, by discharging, the composition by a droplet discharge method, a flattening treatment may be carried out by a CMP method for enhancing its flatness. When the flatness is improved by this process, display variations or the like of the display panel can be reduced, and therefore, a high definition image can be displayed.

Figure 13A:
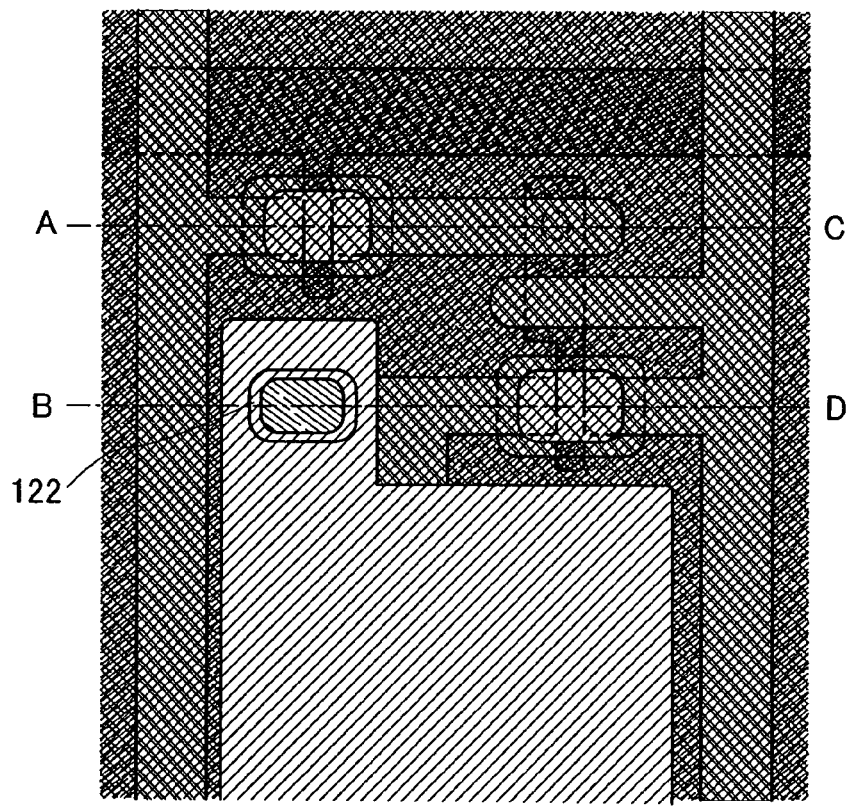
FIGS. 13A to 13C illustrate a manufacturing method of a display device of the present invention.
Figure 13B:
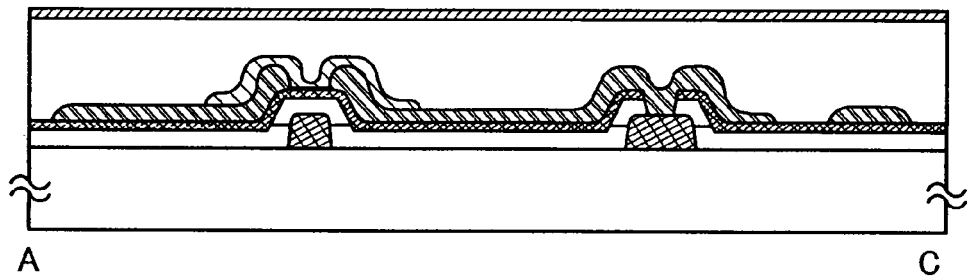
Figure 13C:
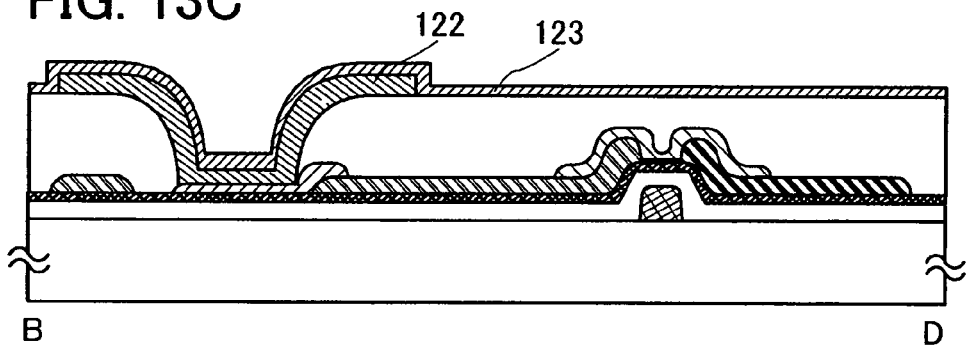

Subsequently, a light emitting element is formed over a substrate for a display panel (FIGS. 13A to 13C). A heat treatment is carried out at 200° C. at atmospheric pressure to remove moisture in the first electrode layer 117 and the insulating layer 121 or adsorbed to the surfaces thereof before formation of the electroluminescent layer 122. Alternatively, a heat treatment at 200 to 400° C., preferably, 250 to 350° C. under reduced pressure is carried out and it is preferable to form the electroluminescent layer 122 without exposure to atmospheric air by a vacuum vapor deposition method or a droplet discharge method under reduced pressure.

As the electroluminescent layer 122, materials exhibiting light emission of red color (R), green color (G), and blue color (B), are selectively formed by a vapor deposition method or the like using a vapor deposition mask. Materials exhibiting light emission of red color (R), green color (G), and blue color (B) can be formed by a droplet discharge method similarly to a color filter. In this case, RGB can be separately formed without using a mask. The second electrode layer 123 is formed over the electroluminescent layer 122 to complete a display device having a display function using a light emitting element.

Note that although not shown, it is advantageous to provide a passivation film as a protective film covering the second electrode layer 123. The passivation film may have a single-layer structure or a stacked-layer structure. The passivation film is formed of an insulating film containing silicon nitride, silicon oxide, silicon oxynitride, silicon nitride oxide containing more nitrogen than oxygen, aluminum nitride, aluminum oxynitride, aluminum nitride oxide containing more nitrogen than oxygen, aluminum oxide, diamond like carbon (hereinafter, referred to as DLC), nitrogen-containing carbon, or the like. For example, a stacked-layer structure in which a silicon nitride film is formed over a nitrogen-containing carbon film, or an organic material can be used, or a stacked layer of high molecule material such as styrene polymer may be used. Alternatively, a siloxane resin may be used.

A film with favorable coverage is preferably used as a passivation film, and a carbon film, particularly a DLC film is preferably used. Since a DLC film can be formed in a temperature ranging from room temperature to 100° C., it can be easily formed over the electroluminescent layer with low heat resistance. A DLC film can be formed by a plasma CVD method (an RF plasma CVD method, a microwave CVD method, an electron cyclotron resonance (ECR) CVD method, a heat filament CVD method, or the like), a combustion method, a sputtering method, an ion beam vapor deposition method, a laser vapor deposition method, or the like. As a reaction gas to be used for film formation, a hydrogen gas and a carbon hydride based gas (such as $CH_4$, $C_2H_2$, or $C_6H_6$) are used. The reaction gas is ionized by glow discharge and the ions are accelerated to collide with a cathode applied with negative self bias, whereby a film is formed. A nitrogen-containing carbon film may be formed by using a $C_2H_4$ gas and a $N_2$ gas. A DLC film has a high blocking effect on oxygen and can suppress oxidation of the electroluminescent layer. Accordingly, a problem that the electroluminescent layer is oxidized while carrying out a subsequent sealing step can be prevented.

Figure 15A:
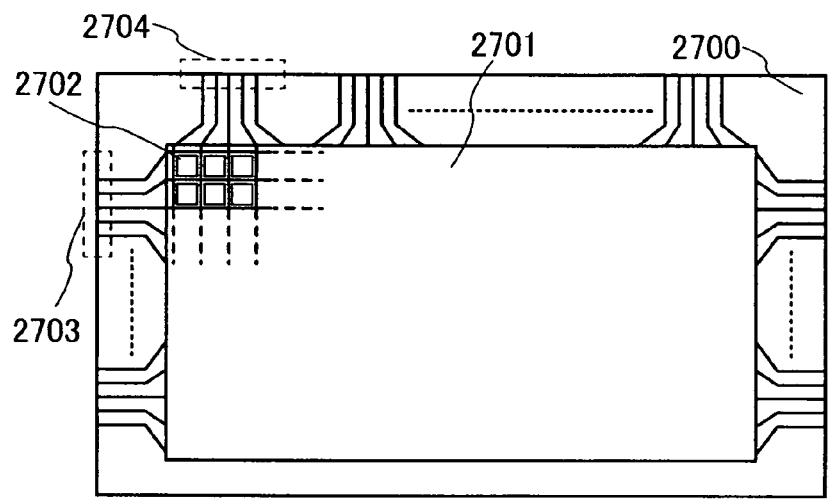
FIGS. 15A to 15C are top views of a display device of the present invention.

The substrate in the display device manufactured in the foregoing manner is described. FIG. 15A is a top view showing a structure of a display panel of the present invention. The display panel includes a pixel portion 2701 having pixels 2702 arranged in matrix, a scanning line side input terminal 2703, and a signal line side input terminal 2704 over a substrate 2700 with an insulating surface. The number of pixels provided may be determined in accordance with various standards. For example, XGA with 1024×768×3 (RGB) pixels, and UXGA with 1600×1200×3 (RGB) pixels may be employed.

The pixels 2702 are arranged in matrix provided at intersections of scanning lines extended from the scanning line side input terminal 2703 and signal lines extended from the signal line side input terminal 2704. Each pixel 2702 includes a switching element and a pixel electrode connected thereto. As a representative example of a switching element, a TFT and a thin film diode (hereinafter, referred to as a TFD) are given. Here, a TFT is described. A TFT has a gate electrode side connected to the scanning line and a source electrode or drain electrode side connected to the signal line, so that the pixels can be controlled independently by a signal inputted from an external portion.

Main component elements of a TFT is a gate insulating layer, a gate electrode layer, a channel formation region in a semiconductor layer, a source region and a drain region formed in the semiconductor layer, and a wiring layer connected thereto. A typical TFT can be classified into two types according to the structure. One is a top gate TFT in which a gate electrode layer is formed over a channel formation region over a substrate. The other is a bottom gate TFT in which a gate electrode layer is formed under a channel formation region and over a substrate. The present invention relates to a manufacturing method of a bottom gate TFT since a gate electrode layer serving as a mask is formed first.

Figure 16A:
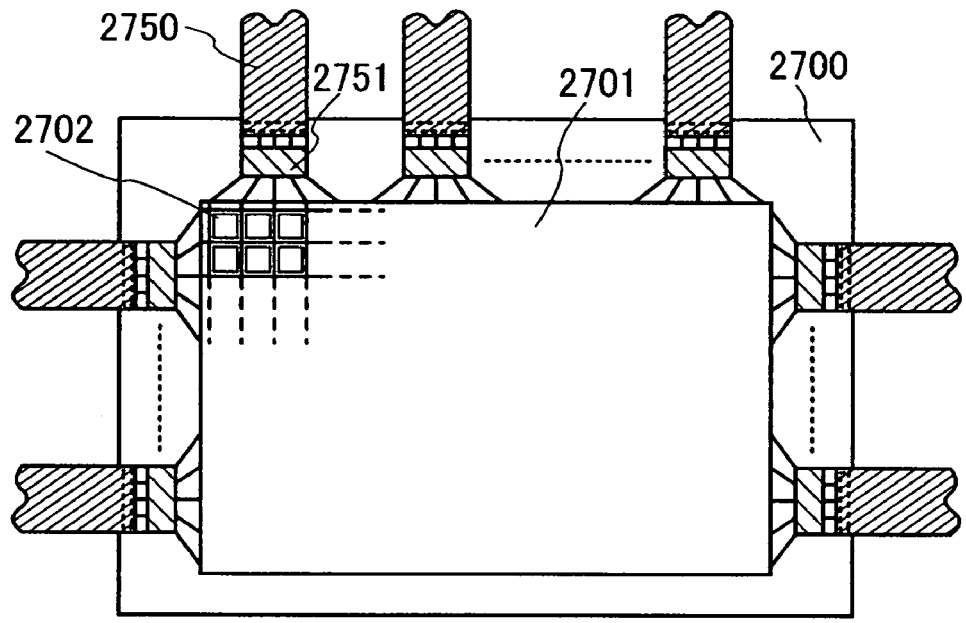
FIGS. 16A and 16B are top views of a display device of the present invention.
Figure 16B:
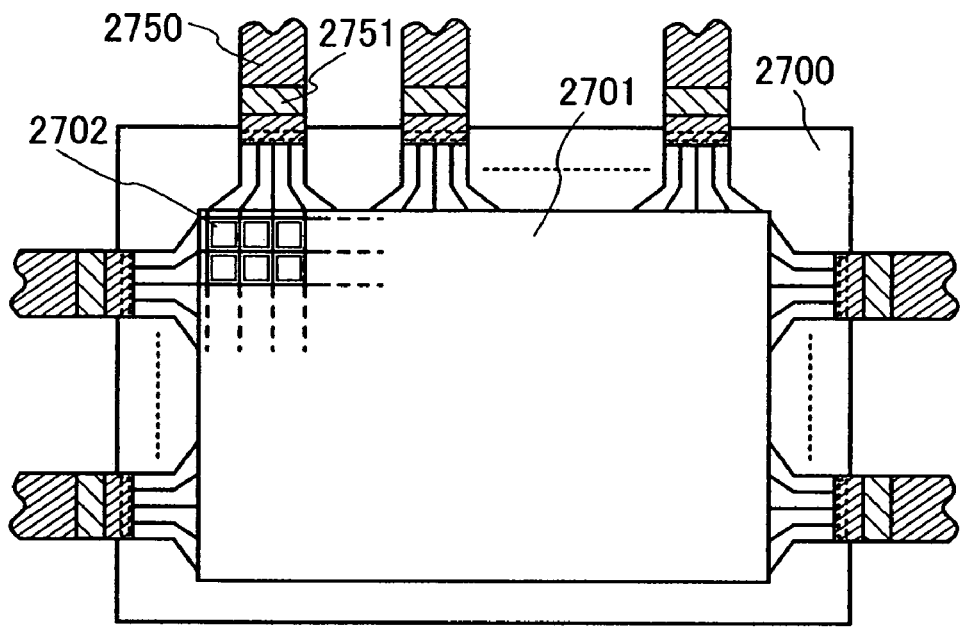

Although FIG. 15A shows a configuration of a display panel in which a signal inputted to the scanning line and the signal line is controlled by an external driving circuit, a driver IC may be mounted over the substrate by a COG (Chip On Glass) method or an SOI method as shown in FIG. 16A. Alternatively, a TAB (Tape Automated Bonding) method shown in FIG. 16B may be used. The driver IC may be formed over a single crystalline semiconductor substrate or may be formed over a glass substrate or a quartz substrate. The driver IC is connected to an FPC (Flexible Printed Circuit). In FIGS. 16A and 16B, a driver IC 2751 is connected to an FPC 2750.

Then, a sealing material is formed, and sealing is conducted using a sealing substrate. Thereafter, a flexible printed circuit is connected to a gate wiring layer which is formed to be electrically connected to the gate electrode layer 103, so that the gate electrode layer 103 is electrically connected to an external portion. A source wiring layer which is formed to be electrically connected to the source electrode or drain electrode layer 111 is treated in a similar manner.

Figure 17A:
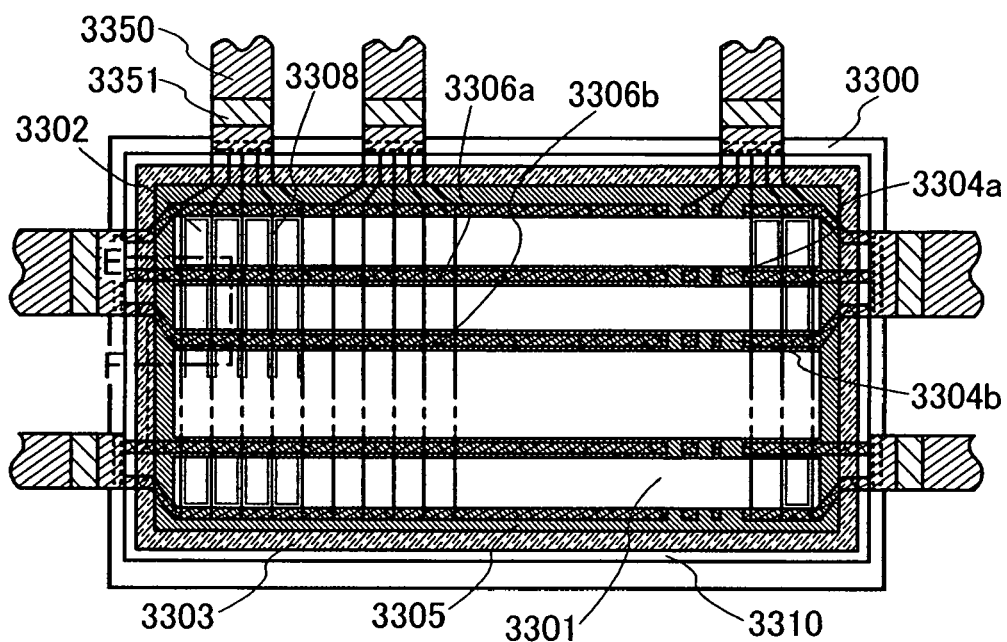
FIGS. 17A and 17B are a top view and a cross-sectional view illustrating a display panel of the present invention.
Figure 17B:
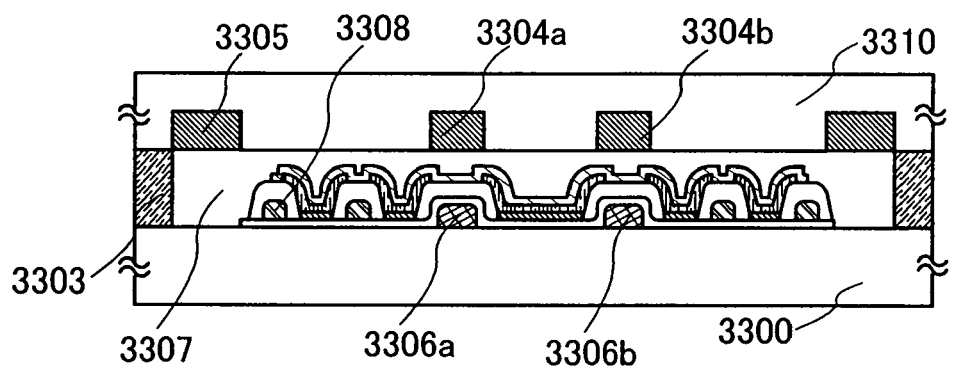

FIGS. 17A and 17B show an example of a completed substrate in a display device manufactured in accordance with the present invention. FIG. 17A is a top view of an EL display panel, and FIG. 17B is a cross-sectional view taken along a line E-F in FIG. 17A. In FIGS. 17A and 17B, a pixel portion 3301 formed over an element substrate 3300 includes a pixel 3302, a gate wiring layer 3306a, a gate wiring layer 3306b, and a source wiring layer 3308 and is attached and fixed by a sealing substrate 3310 and a sealing material 3303. In this embodiment mode, a driver IC 3351 is provided over an FPC 3350 and is mounted by a TAB method.

As shown in FIGS. 17A and 17B, drying agents 3305, 3304a, and 3304b are provided in the display panel in order to prevent an element from deteriorating due to moisture. The drying agent 3305 is formed to surround the pixel portion and the drying agents 3304a and 3304b are formed in regions corresponding to the gate wiring layers 3306a and 3306b. Here, the drying agent is provided in a depression formed in the sealing substrate so as not to prevent reduction in size and thickness of the display device. In addition, a water absorption area can be enlarged by providing the drying agent in a region corresponding to a gate wiring layer, which improves a water absorption effect. Further, light extraction efficiency is not decreased since the drying agent is formed over the gate wiring layer, which itself does not emit light. Here, a filler 3307 is filled in the display panel. When a substance having a hygroscopic substance such as a drying agent is used, further water absorption effect can be obtained, whereby deterioration of the element can be prevented.

In this embodiment mode, a case where a light emitting element is sealed by a glass substrate is shown. Sealing is a treatment for protecting the light emitting element from moisture, and is performed employing any of the following methods: a method in which the light emitting element is mechanically sealed with a cover material; a method in which the light emitting element is sealed with a thermosetting resin or an ultraviolet curing resin; and a method in which the light emitting element is sealed with a thin film having a high barrier property, such as metal oxide, metal nitride, or the like. The cover material can be glass, ceramic, plastic, or metal.

When light is emitted to the cover material side, the cover material needs to have a light-transmitting property. The cover material is attached to the substrate which is provided with the light emitting element by a sealing material such as a thermosetting resin or an ultraviolet curing resin, and the resin is cured by a heat treatment or an ultraviolet irradiation treatment, thereby forming an enclosed space. It is also advantageous to provide a moisture absorbent typified by barium oxide in this enclosed space. The moisture absorbent may be provided on the sealing material to be in contact therewith, or over the partition or the periphery thereof so as not to interfere with light from the light emitting element. Further, a space between the cover material and the substrate provided with the light emitting element can be filled with a thermosetting resin or an ultraviolet curing resin. In this case, it is advantageous to add a moisture absorbent typified by barium oxide to the thermosetting resin or the ultraviolet curing resin.

Although a case where a switching TFT has a single gate structure is shown, a switching TFT with a multi gate structure such as a double gate structure or the like may be employed.

Note that although a light emitting device is described in this embodiment mode, a TFT formed in accordance with the present invention can also be applied to a liquid crystal display device. A light emitting element is not necessary in a liquid crystal display device; therefore, the process up to formation of the first electrode layer 117 may be carried out. In addition, by forming various patterns over a substrate directly by a droplet discharge method, a display panel can be manufactured with a small number of steps even if a large glass substrate which is difficult to be exposed to light at one time is used.

With the present invention, the desired pattern can be formed with good controllability. Also, less material is wasted, which leads to reduction in cost. Accordingly, a high performance TFT with high reliability can be manufactured with a high yield.

Embodiment Mode 3

Figure 21:
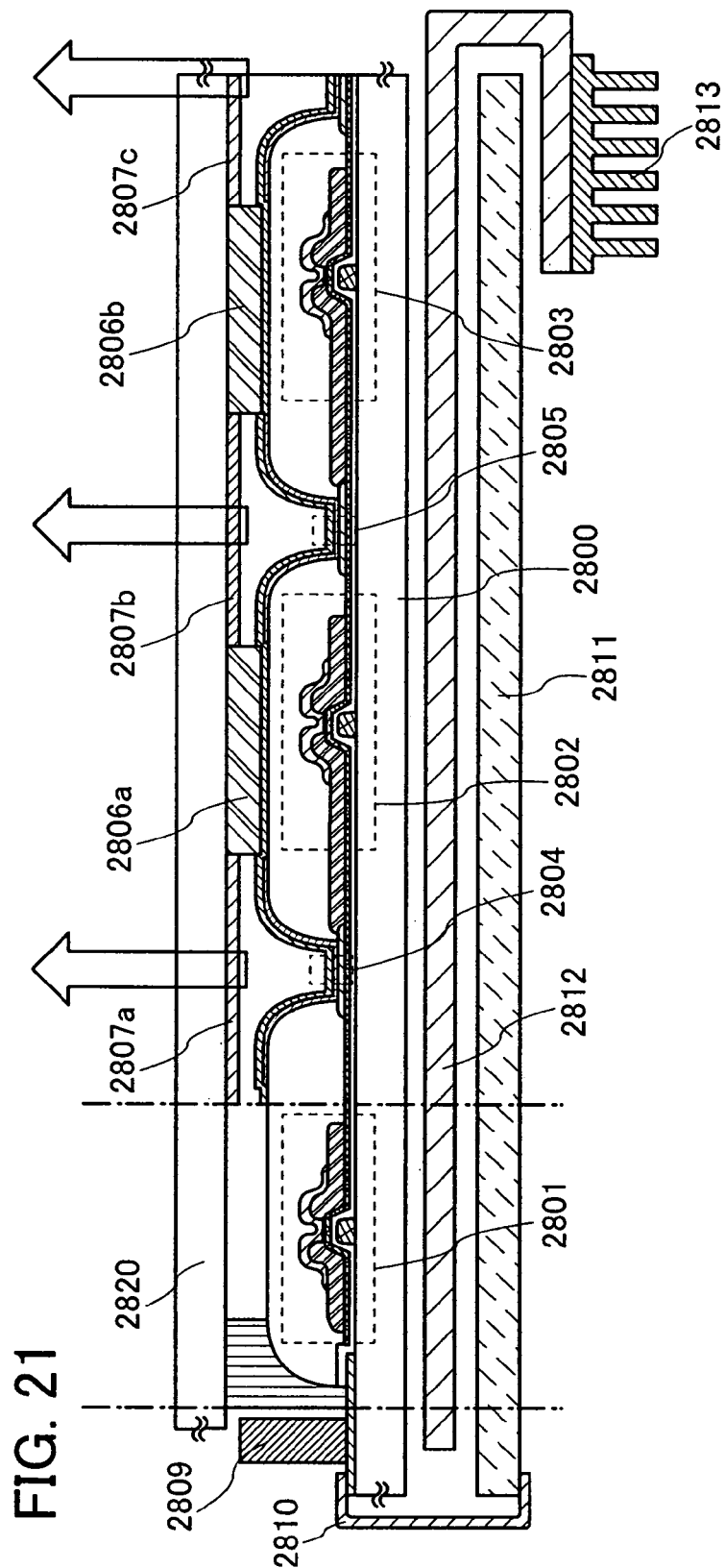
FIG. 21 is a cross-sectional view illustrating a structural example of an EL display module of the present invention.

In this embodiment mode, a light emitting device to which the present invention is applied is described. FIG. 21 shows an example of a light emitting device manufactured in accordance with the present invention. In FIG. 21, a pixel portion including a pixel is formed over a substrate 2800.

FIG. 21 shows a part of a section of a top emission light emitting display device including light emitting elements 2804 and 2805. Light is emitted in a direction shown by arrows in the drawing. Multicolor display can be carried out by setting different emission colors of red, green, and blue between neighboring pixels. In addition, by forming color layers 2807a, 2807b, and 2807c which correspond to light-emission colors at the sealing substrate 2820 side, color purity of light-emission colors can be improved. Alternatively, a pixel may include a white light emitting element and the color layers 2807a, 2807b, and 2807c may be combined.

The substrate 2800 is fixed to the sealing substrate 2820 through spacers 2806a and 2806b. The spacer is provided in order to keep a gap between the two substrates constant even if a substrate is thin and an area of a pixel portion is enlarged. The height of spacers is required to be controlled strictly in order to keep the gap between the two substrates constant. Therefore, a photolithography method is preferably used, but it is not limited thereto and any method can be used as long as spacers having uniform heights can be formed. A gap between the substrate 2800 and the sealing substrate 2820 and over the light emitting elements 2804 and 2805 which are connected to pixel TFTs 2802 and 2803, respectively; may be filled with a light-transmitting resin material, anhydrous nitrogen, or an inert gas.

A diving circuit 2809 is connected to a scanning line or signal line connection terminal which is provided to one end of an external circuit substrate 2811, through a wiring substrate 2810. In addition, a heat pipe 2813 and a radiator plate 2812 may be provided in contact with or close to the substrate 2800 so as to enhance the effect of heat release.

Note that a TFT similar to one formed in the pixel or a protective circuit TFT 2801 which is the TFT with its gate electrode and one of its source electrode or drain electrode connected so that it serves similarly to a diode, may be provided outside the pixel portion and between the driving circuit 2809 and the pixel TFT 2802. As the driving circuit 2809, a driver IC formed of a single crystalline semiconductor, a stick driver IC formed of a polycrystalline semiconductor film over a glass substrate, a driving circuit formed of an SAS, or the like is applied.

Note that although a top emission type is shown in FIG. 21, a bottom emission type or a dual emission type in which light is emitted upwardly and downwardly may also be employed by changing the structure of the light emitting element and location of the external circuit substrate. In the case of the top emission type, an insulating layer serving as a partition wall may be colored to be used as a black matrix. This partition wall can be formed by a droplet discharge method and formed by mixing a black pigment resin, carbon black, or the like into a resin material such as polyimide. Further, the partition wall may be a single layer or stacked layers.

In addition, a resin film may be attached to the pixel portion side of the substrate 2800 using a sealing material or an adhesive resin to form a sealed structure. Although glass sealing using a glass substrate is shown here, various sealing methods such as resin sealing using a resin, plastic sealing using plastic, or film sealing using a film can be used. A barrier film for preventing penetration of moisture is preferably provided on a surface of the resin film. By employing a film sealing structure, further reduction in thickness and weight can be achieved.

Figure 18:
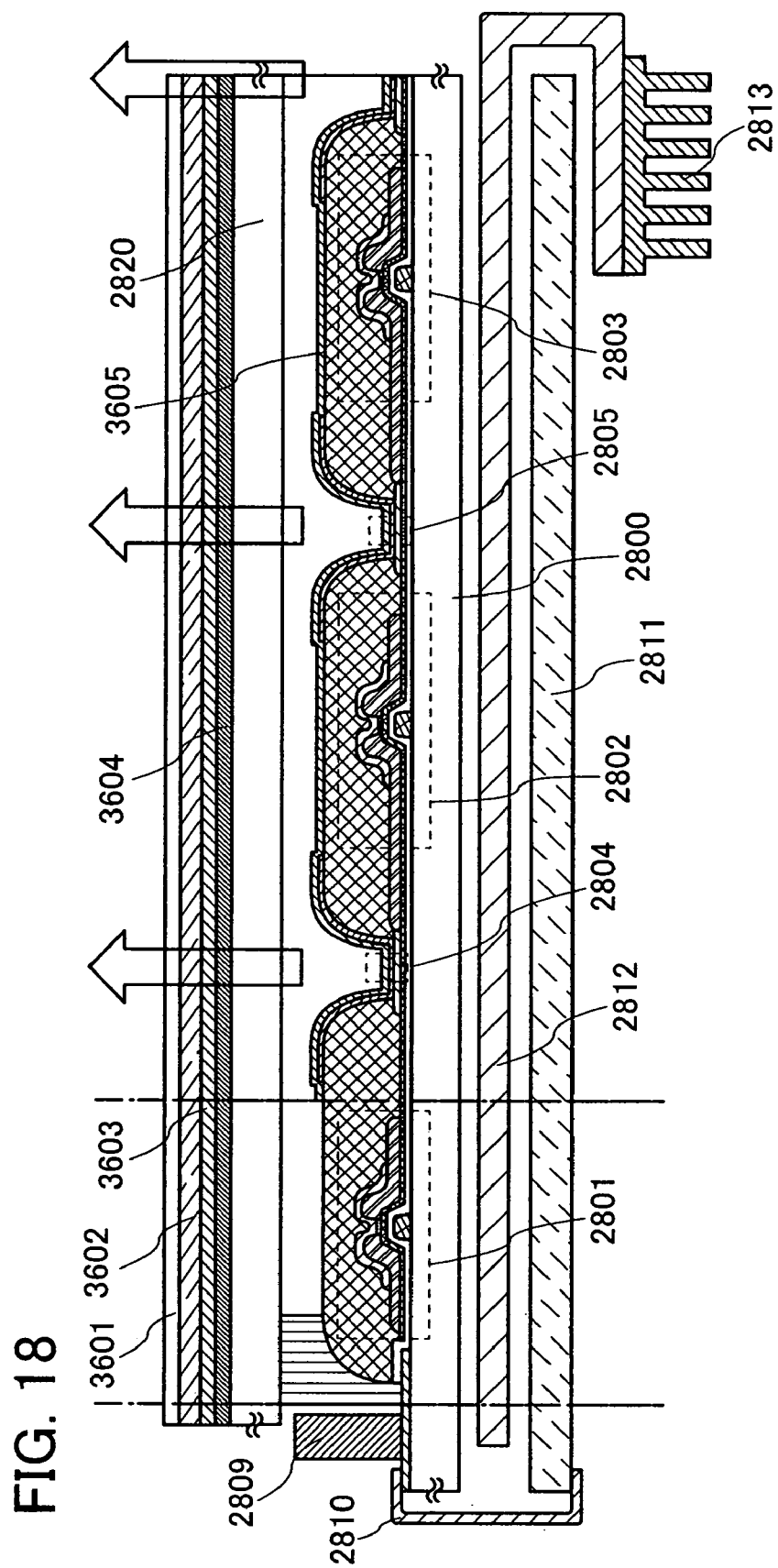
FIG. 18 is a cross-sectional view illustrating a structural example of an EL display module of the present invention.

As shown in FIG. 18, a structure in which reflected light of light from an external portion may be blocked by using a retardation plate or a polarizing plate. FIG. 18 shows a top emission EL display module including the protective TFT 2801, the pixel TFTs 2802 and 2803, the light emitting element 2805, the driving circuit 2809, the wiring substrate 2810, the external portion circuit substrate 2811, the radiator plate 2812, and the heat pipe 2813, in which an insulating layer 3605 serving as a partition wall is colored to be used as a black matrix. The insulating layer 3605 can be formed by a droplet discharge method. The insulating layer 3605 may be formed of carbon black or the like mixed in a resin material such as polyimide or the like, or may be a stacked layer thereof. The insulating layer 3605 may be formed by discharging different materials in the same region for a plurality of times by a droplet discharge method. Here, a black pigment resin is used. As retardation plates 3603 and 3604, a quarter-wave plate or a half-wave plate is used and they are designed so that light can be controlled. The EL display module has a structure in which the substrate 2800, the light emitting element 2804, the sealing substrate 2820, the retardation plate 3603, the retardation plate 3604, and a polarizing plate 3602 are sequentially arranged. Light emitted from the light emitting element passes them and is emitted to outside from the polarizing plate side. It is acceptable as long as the retardation plate and the polarizing plate are located on the side which is irradiated with light. In the case of a dual emission display device which emits light to both sides, they may be provided on both sides. In addition, an antireflection film 3601 may be provided outside the polarizing plate. Accordingly, a higher-definition and more precise image can be displayed.

As described above, with the present invention, the desired pattern can be formed with good controllability. Also, less material is wasted, which leads to reduction in cost. Accordingly, a high performance TFT with high reliability can be manufactured with a high yield.

Embodiment Mode 4

Figure 15B:
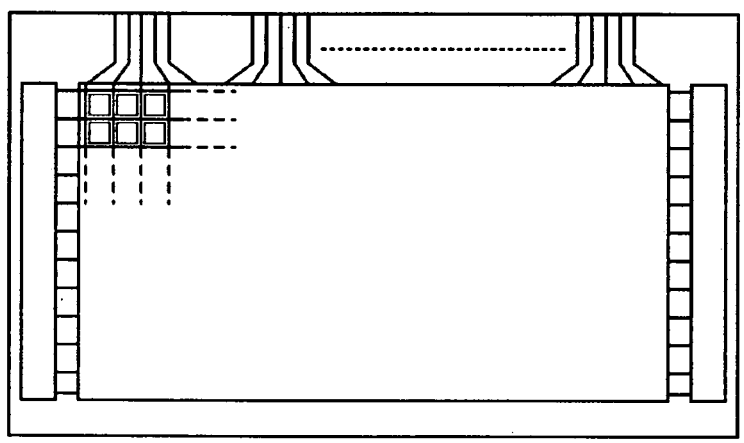
Figure 15C:
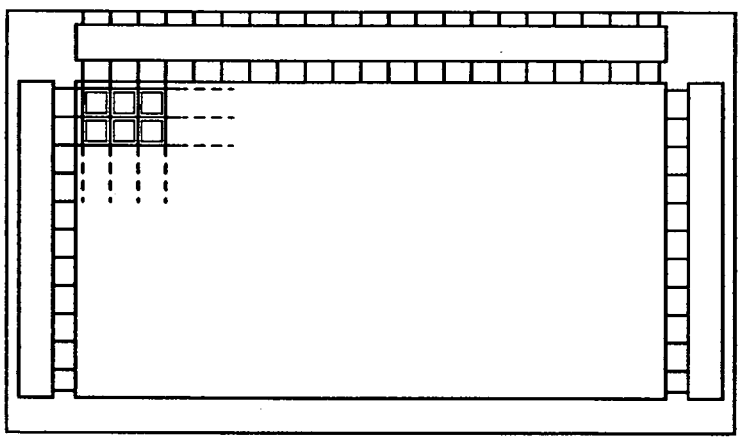

A television device or the like can be manufactured with a liquid crystal display device to which the present invention is applied. A display panel may only include a pixel portion, and a scanning line side driving circuit and a signal line side driving circuit may be mounted thereto by a TAB method shown in FIG. 16B, as shown in FIG. 15A. A display panel may have a scanning line side driving circuit and a signal line side driving circuit formed over a substrate and mounted to the display panel by a COG method shown in FIG. 16A, as shown in FIG. 15C. Alternatively, a display panel may have a pixel portion and a scanning line side driving circuit formed over a substrate and a signal line side driving circuit is separately mounted as a driver IC, as shown in FIG. 15B. Here, the case in which a display panel only includes a pixel portion and a scanning line side driving circuit and a signal line side driving circuit may be mounted thereto by a TAB method shown in FIG. 16B, as shown in FIG. 15A is described.

Figure 14:
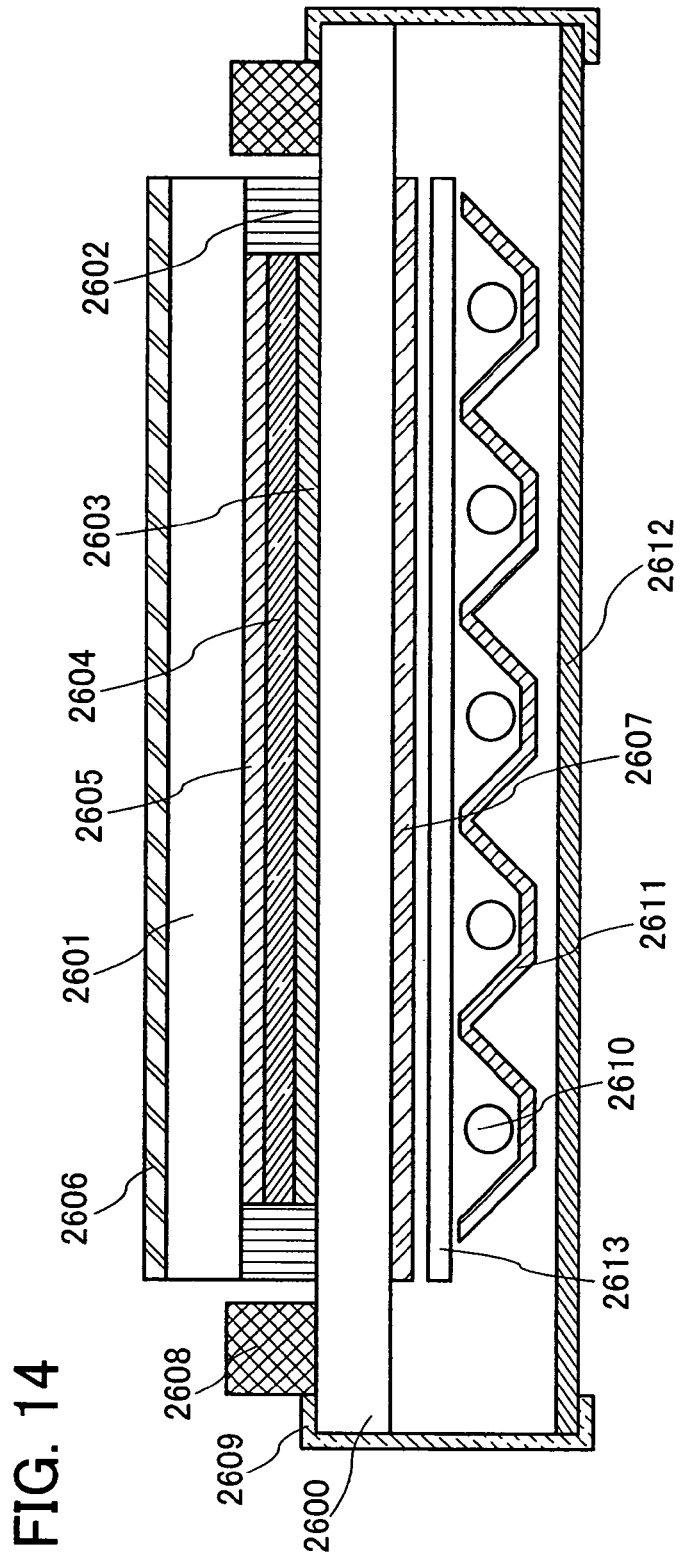
FIG. 14 is a cross-sectional view illustrating a structural example of a liquid crystal display module of the present invention.

FIG. 14 shows an example of a liquid crystal display module in which a TFT substrate 2600 and a counter substrate 2601 are fixed by a sealing material 2602, and a pixel portion 2603 and a liquid crystal layer 2604 are provided therebetween to form a display region. A color layer 2605 is necessary to carry out color display. In the case of an RGB method, color layers corresponding red, green, and blue are provided to each pixel. Retardation plates 2606, 2607, and a lens film 2613 are provided out side of the TFT substrate 2600 and the counter substrate 2601. A light source includes a cold-cathode tube 2610 and a reflecting plate 2611. A circuit substrate 2612 is connected to the TFT substrate 2600 through a driving circuit 2608 and a flexible wiring substrate 2609, and an eternal circuit such as a control circuit, a power supply circuit, or the like is incorporated into the circuit substrate 2612.

Figure 19A:
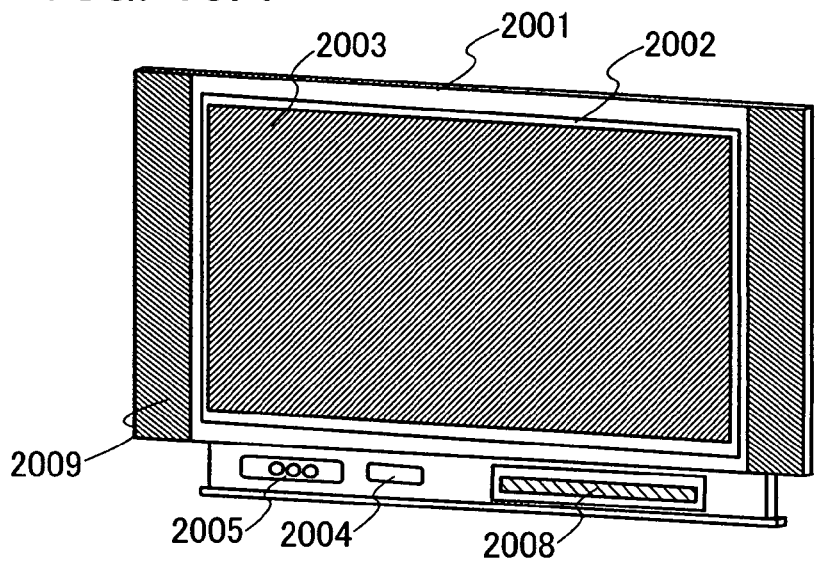
FIGS. 19A and 19B show an electronic appliance to which the present invention is applied.
Figure 19A:
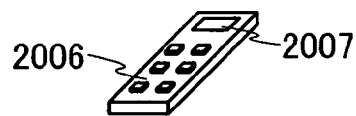

FIG. 19A shows a television device using a liquid crystal display device manufactured in accordance with the present invention. A display panel 2002 is incorporated in a chassis 2001, and the television device can receive general TV broadcast using a receiver 2005 and further can be connected to a wired or a wireless communication network via a modem 2004 so that one-way (from a sender to a receiver) or two-way (between a sender and a receiver or between receivers) information communication can be carried out. The television device can be operated by an operation switch of the chassis or a separate remote control unit 2006. The remote control unit may have a display potion 2007 which displays information to be outputted. Further, the television device includes a speaker portion 2009.

Also, the television device may include a sub screen 2008 formed using a second display panel for displaying channels, volume, and the like, in addition to a main screen 2003. In this structure, the main screen 2003 and the sub screen 2008 may be formed using a panel for a liquid crystal display. Note that in order to reduce the power consumption, a structure in which the sub screen which can carry out display by blinking may be employed. With use of the present invention, a highly reliable display device can be manufactured even if a large substrate and a number of TFTs and electronic parts are used.

Figure 19B:
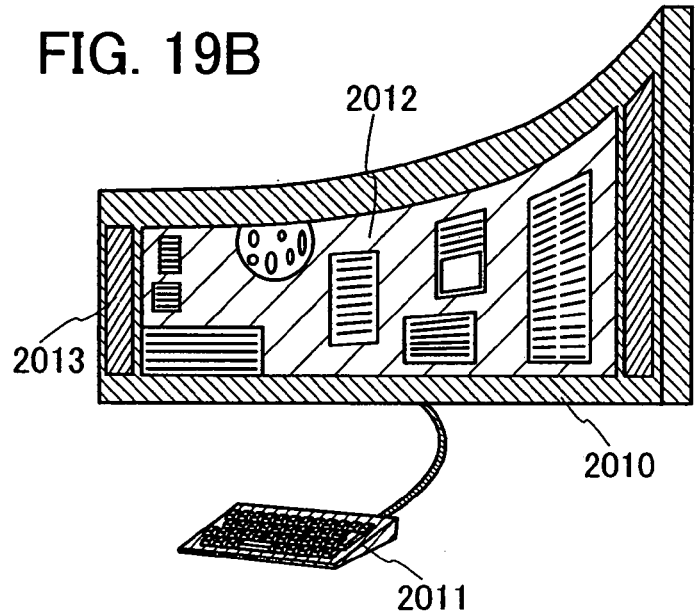

FIG. 19B shows a television device having a large display portion of approximately 20 to 80 inches. The television device includes a chassis 2010, a key board portion 2011 which is an operation portion, a display portion 2012, a speaker portion 2013, and the like. A TFT manufactured by using the present invention can be used to manufacture the display portion 2012. Since a substance which can be curved is used for a display portion in FIG. 19B, a television device having a curved display portion is formed. In accordance with the present invention, a shape of the display portion can be designed freely; therefore, a television device with a desired shape can be manufactured.

Note that although in this embodiment mode, a television device shown in FIGS. 19A and 19B is manufactured by using a liquid crystal display device, a display device using a light emitting element may be manufactured in combination with another embodiment mode.

With the present invention, a desired pattern can be manufactured with good controllability and a TFT can be manufactured with reduced waste of material and reduced cost. Accordingly, a television device having a display portion with a large screen can be manufactured with reduced cost. Further, since defect in formation is not generated even if the television device is thin and the wiring thereof is precise, a high performance television device with high reliability can be manufactured with a high yield.

The present invention is not limited to a television device and can be applied to a monitor of a personal computer; a large display screen such as an information screen in a train station, an air port, and the like, and a display screen of street advertisement, and the like.

Embodiment Mode 5

As described in Embodiment Modes 1 to 4, various display devices can be manufactured by using the present invention. In this embodiment mode, applications of the present invention are described.

As an example of an electronic appliance to which the present invention is applied, a camera such as a video camera or a digital camera, a projector, a head mounted display (a goggle type display), a car navigation system, a car stereo, a personal computer, a game machine, a portable information terminal (such as a mobile computer, a portable phone, or an electronic book), an image reproducing device provided with a recording medium (specifically, a device for reproducing a recording medium such as a digital versatile disc (DVD), and having a display portion for displaying the reproduced image), or the like can be given. FIGS. 20A to 20D show examples thereof.

Figure 20A:
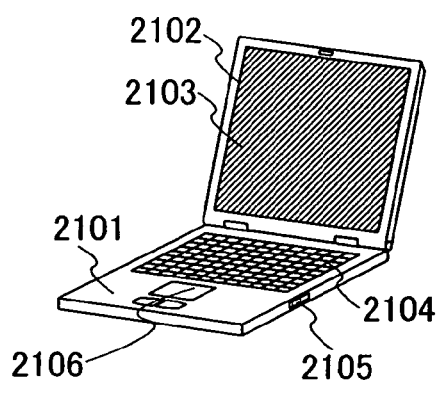
FIGS. 20A to 20D show electronic appliances to which the present invention is applied.

FIG. 20A is a computer including a main body 2101, a chassis 2102, a display portion 2103, a keyboard 2104, an external connection port 2105, a pointing device 2106, and the like. With use of the present invention, a computer which displays a high quality image with high reliability can be manufactured even if the computer is miniaturized and a wiring and the like thereof are precisely formed.

Figure 20B:
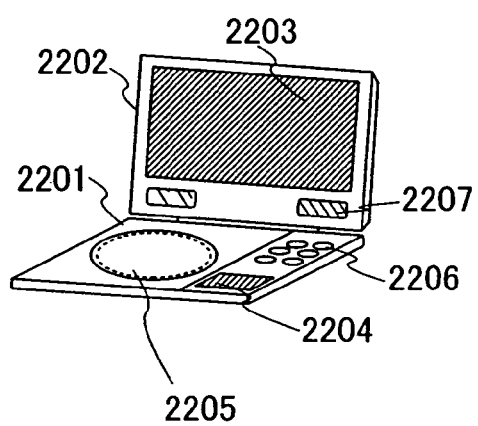

FIG. 20B is an image reproducing device provided with a recording medium (specifically, a DVD reproducing device), which includes a main body 2201, a housing 2202, a first display portion 2203, a second display portion 2204, a recording medium reading portion 2205, an operation key 2206, a speaker portion 2207, and the like. Note that the recording medium refers to a DVD or the like. The first display portion 2203 mainly displays image information, while the second display portion 2204 mainly displays text information. In accordance with the present invention, an image reproducing device which displays a fine image with high reliability can be manufactured even if the image reproducing device is miniaturized and a wiring and the like thereof are precisely formed.

Figure 20C:
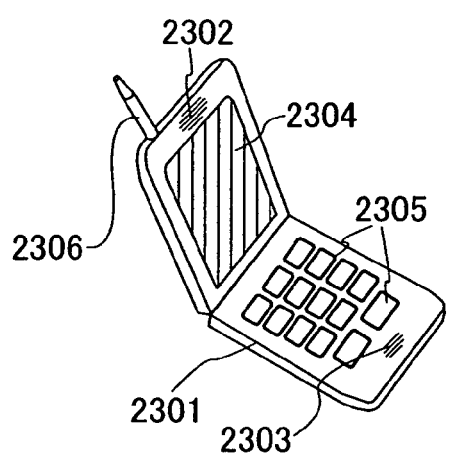

FIG. 20C is a portable phone including a main body 2301, an audio output portion 2302, an audio input portion 2303, a display portion 2304, an operation switch 2305, an antenna 2306, and the like. In accordance with the present invention, a portable phone which displays a fine image with high reliability can be manufactured even if the portable phone is miniaturized and a wiring and the like thereof are precisely formed.

Figure 20D:
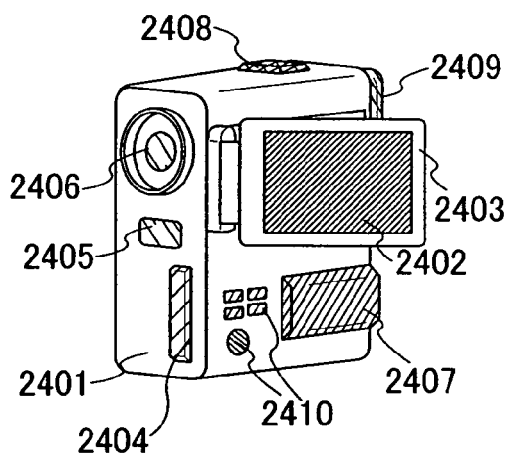

FIG. 20D is a video camera including a main body 2401, a display portion 2402, a housing 2403, an external connection port 2404, a remote controlling portion 2405, an image receiving portion 2406, a battery 2407, an audio input portion 2408, an eye piece portion 2409, an operation key 2410, and the like. In accordance with the present invention, a video camera which displays a fine image with high reliability can be manufactured even if the a video camera is miniaturized and a wiring and the like thereof are precisely formed.

As described above, a display device can be manufactured by applying the present invention thereto. By applying the present invention, high performance various electronic appliances with high reliability can be manufactured.

Embodiment 1

An experiment for ensuring that a photocatalytic film is essential in back surface exposure and that a substance having low wettability is not decomposed in a step of etching the photocatalytic film, which are described in this specification, was carried out. Two kinds of samples were prepared and contact angles of pure water were measured. In this embodiment, description is made based on the result.

The two samples are referred to as sample A and sample B. Glass was used for substrates. First, HMDS was formed as a substance having low wettability over the glass substrates by heating HMDS to 150° C. to vaporize HMDS and the substrates were exposed to the vapor for 10 minutes. Then, in sample B, a film of zinc oxide was formed as a photocatalytic substance over HMDS by a spin coating method. A water solution of zinc acetate was used as a precursor for forming the film of zinc oxide. Thereafter, baking was carried out at 150° C. for 30 minutes.

Then, ultraviolet light irradiated the sample from a back surface of the substrate, that is, the surface where HMDS was not formed, so that light passed through the glass substrate to a surface where HMDS was formed. As a light source, a metal halide lamp was used, and light with a wave length of 250 to 450 nm was used.

Subsequently, zinc oxide in sample B was removed with hydrochloric acid diluted to 0.07%.

Figure 23:
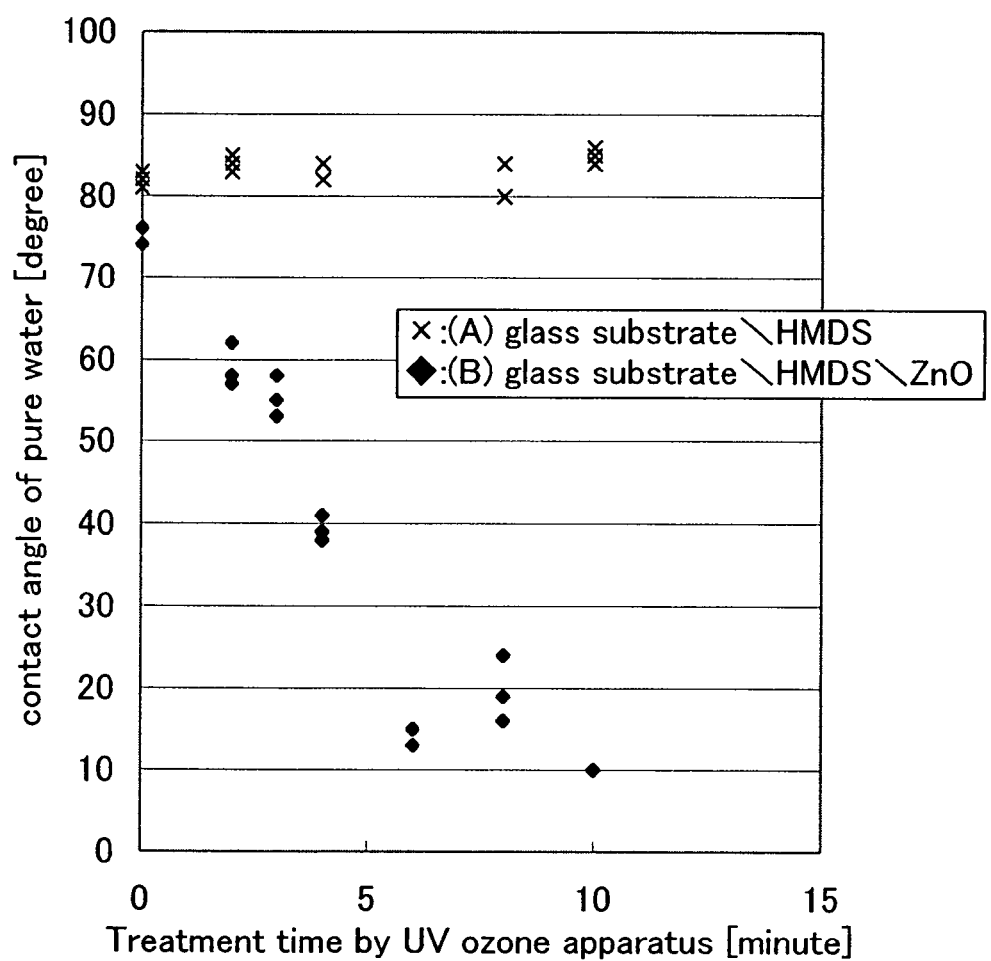
FIG. 23 is a graph showing an effect of a photocatalytic substance in the present invention.

Then, contact angles of pure water with respect to an ultraviolet light irradiation time by back surface exposure were measured in sample A and sample B. As shown in FIG. 23, in sample A, to which back surface exposure was carried out without zinc oxide being formed, variation in contact angle of pure water was not recognized as the light exposure time increased. On the other hand, in sample B, to which back surface exposure was carried out with zinc oxide formed, the contact angle of pure water tended to be small as the light exposure time increased. That is, the wettability of sample B was heightened by back surface exposure.

In addition, since there was not much difference in contact angles between sample A and sample B before back light exposure, it was ensured that HDMS was not decomposed in a step of etching zinc oxide.

Embodiment 2

A TFT was manufactured using the present invention, and the electrical characteristics thereof were measured. In this embodiment mode, an effect of the present invention is described based on the result.

Glass was used for a substrate. Tungsten (W) was formed over the glass substrate by a sputtering method to have a thickness of 100 nm as a gate electrode layer, and silicon oxynitride was formed by a plasma CVD method to have a thickness of 100 nm as a gate insulating layer. In a chamber, a mixed gas of $SiH_4$ and $N_2O$ was introduced so that the composition ratio was 1:200, and the pressure thereof was adjusted to be 0.30 Torr. HMDS was formed thereover as a substance having low wettability by vaporizing HMDS and exposing the substrate to the vapor. Then, a water solution of zinc acetate was selectively discharged by a droplet discharge method over a gate insulating layer on which HMDS was formed. Here, the region in which the water solution of zinc acetate was discharged was a region overlapping the gate electrode and a region where a wiring layer of a composition containing silver was to be formed in a subsequent step. After the discharging, baking was carried out at 150° C. for 30 minutes. Accordingly, a layer of zinc oxide having a thickness of 150 nm was formed as a photocatalytic layer.

Then, ultraviolet light irradiated the back surface of the substrates, that is, the surface where the gate electrode layer or the like was not formed, so that light passes through the glass substrate to the surface where the gate electrode layer or the like was formed. As a light source, a metal halide lamp was used and light with a wavelength of 250 to 450 nm was used. Light irradiation was carried out for a period of time which is required to remove the substance lowering wettability in HMDS. It is acceptable if the irradiation time is set to be 5 minutes or more. By carrying out light irradiation from the back surface as described above, HMDS in a region under a region where the zinc oxide layer was formed and which did not overlap the gate electrode layer was decomposed. Accordingly, two regions having different wettability were formed. Thereafter, the zinc oxide layer was removed with use of hydrochloric acid diluted to 0.07%.

Then, an organic resin layer was formed of polyimide in a region having lower wettability. The organic resin layer was formed by a droplet discharge method. Thereafter, a composition in which silver was dissolved in an organic solvent was discharged over the organic resin, and then, baking was carried out at 180° C. for 30 minutes. Subsequently, HMDS was removed by a UV ozone apparatus, and ODS was formed by using a spin coating method. Finally, pentacene was formed by a vacuum vapor deposition method to have a thickness of 50 nm.

Figure 24:
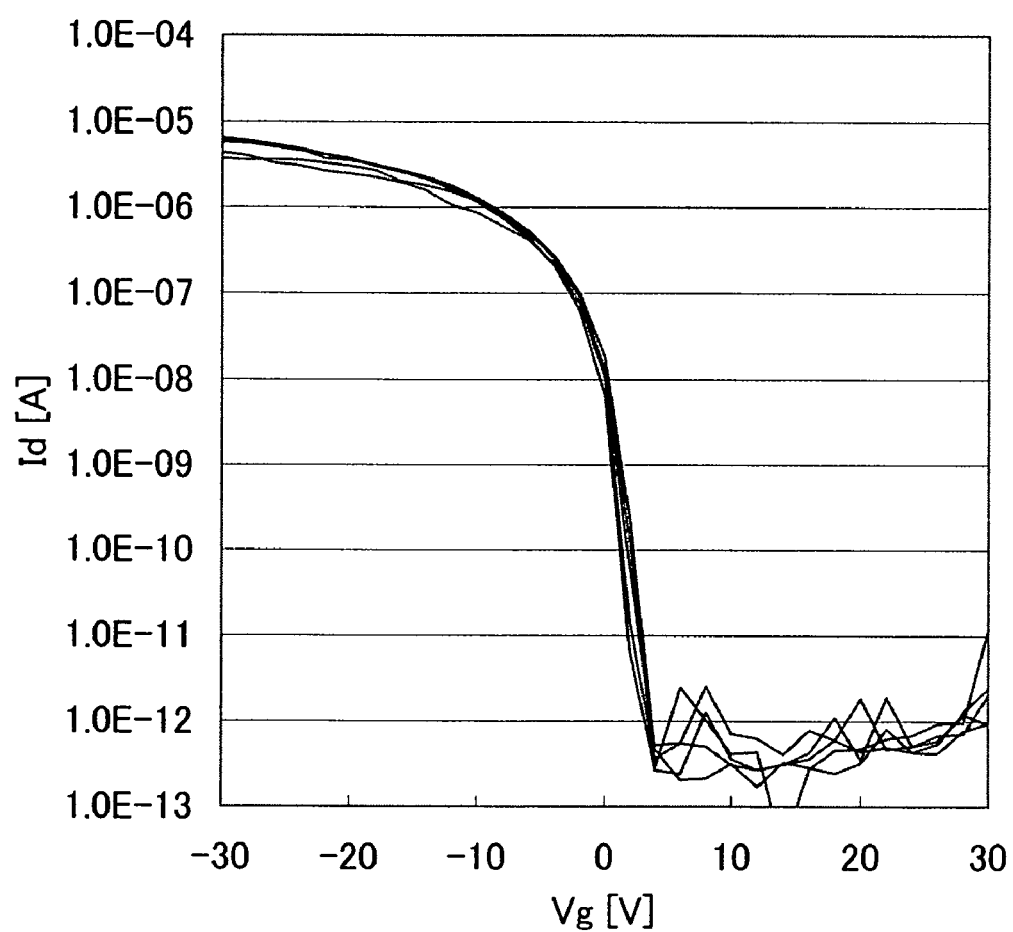
FIG. 24 is a graph showing a drain current with respect to a gate voltage of a TFT manufactured by the present invention.

In the TFT manufactured by the foregoing method, drain current with respect to gate voltage was measured. The result thereof is shown in FIG. 24. As shown in FIG. 24, the TFTs manufactured with use of the present invention have favorable electrical characteristics with less variation. Note that a channel length was 60 μm and a channel width was 990 μm.

As described above, with the present invention, the pattern can be formed with good controllability. Accordingly, a TFT with favorable electrical characteristics can be manufactured with reduced waste of material and reduced cost.

This application is based on Japanese Patent Application serial no. 2006-057021 filed in Japan Patent Office on Mar. 02, in 2006, the entire contents of which are hereby incorporated by reference.

What is claimed is:

1. A method for forming a thin film transistor, comprising the steps of:

forming a light-blocking first conductive layer over a major surface of a light-transmitting substrate;

forming a first film in a first region over the substrate and the first conductive layer;

forming a photocatalytic film in at least a part of the first region over the first film;

heating the photocatalytic film in vacuum;

changing wettability of the first film in a second region which is in the first region, being in contact with the photocatalytic film, and not overlapping the first conductive layer, by light irradiation from a back surface opposite to the major surface of the substrate;

removing the photocatalytic film; and discharging a composition including a second conductive layer forming material in the second region so as to form a source and drain electrode.

2. The method for forming the thin film transistor according to claim 1, wherein wettability with respect to the composition of the second region is higher than that of the first region.

3. The method for forming the thin film transistor according to claim 1, wherein the photocatalytic film comprises zinc oxide.

4. The method for forming the thin film transistor according to claim 1, wherein the first film comprises alkylsilane or fluoroalkylsilane.

5. The method for forming the thin film transistor according to claim 1, wherein the light has a wavelength of 380 nm or less.

6. The method for forming the thin film transistor according to claim 1, wherein the first conductive layer is a gate electrode layer.

7. A method for forming an electronic appliance including the thin film transistor according to claim 1, further comprising a step of incorporating the thin film transistor into the electronic appliance.

8. The method for forming the electronic appliance according to claim 7, wherein the electronic appliance is any one of a video camera, a digital camera, a projector, a head mounted display, a car navigation system, a car stereo, a personal computer, a game machine, a portable information terminal, or an image reproducing device provided with a recording medium.

9. A method for forming a thin film transistor, comprising the steps of:

forming a light-blocking first conductive layer over a major surface of a light-transmitting substrate;

forming a first film in a first region over the substrate and the first conductive layer;

forming a photocatalytic film in at least a part of the first region over the first film;

heating the photocatalytic film under hydrogen flow;

changing wettability of the first film in a second region which is in the first region, being in contact with the photocatalytic film, and not overlapping the first conductive layer, by light irradiation from a back surface opposite to the major surface of the substrate;

removing the photocatalytic film; and discharging a composition including a second conductive layer forming material in the second region so as to form a source and drain electrode.

10. The method for forming the thin film transistor according to claim 9, wherein wettability with respect to the composition of the second region is higher than that of the first region.

11. The method for forming the thin film transistor according to claim 9, wherein the photocatalytic film comprises zinc oxide.

12. The method for forming the thin film transistor according to claim 9, wherein the first film comprises alkylsilane or fluoroalkylsilane.

13. The method for forming the thin film transistor according to claim 9, wherein the light has a wavelength of 380 nm or less.

14. The method for forming the thin film transistor according to claim 9, wherein the first conductive layer is a gate electrode layer.

15. A method for forming an electronic appliance including the thin film transistor according to claim 9, further comprising a step of incorporating the thin film transistor into the electronic appliance.

16. The method for forming the electronic appliance according to claim 15, wherein the electronic appliance is any one of a video camera, a digital camera, a projector, a head mounted display, a car navigation system, a car stereo, a personal computer, a game machine, a portable information terminal, or an image reproducing device provided with a recording medium.

17. A method for forming a thin film transistor, comprising the steps of:

forming a light-blocking mask over a major surface of a light-transmitting substrate;

forming a first film in a first region over the substrate and the first conductive layer;

forming a photocatalytic film in at least a part of the first region over the first film;

heating the photocatalytic film under hydrogen flow;

changing wettability of the first film in a second region which is in the first region, being in contact with the photocatalytic film, and not overlapping the mask, by light irradiation from a back surface opposite to the major surface of the substrate;

removing the photocatalytic film; and discharging a composition including a pattern forming material in the second region so as to form a source and drain electrode.

18. The method for forming the thin film transistor according to claim 17, wherein wettability with respect to the composition of the second region is higher than that of the first region.

19. The method for forming the thin film transistor according to claim 17, wherein the photocatalytic film comprises zinc oxide.

20. The method for forming the thin film transistor according to claim 17, wherein the first film comprises alkylsilane or fluoroalkylsilane.

21. The method for forming the thin film transistor according to claim 17, wherein the light has a wavelength of 380 nm or less.

22. The method for forming the thin film transistor according to claim 17, wherein the first conductive layer is a gate electrode layer.

23. A method for forming an electronic appliance including the thin film transistor according to claim 17, further comprising a step of incorporating the thin film transistor into the electronic appliance.

24. The method for forming the electronic appliance according to claim 23, wherein the electronic appliance is any one of a video camera, a digital camera, a projector, a head mounted display, a car navigation system, a car stereo, a personal computer, a game machine, a portable information terminal, or an image reproducing device provided with a recording medium.

25. A method for forming a thin film transistor, comprising the steps of:
   forming a light-blocking mask over a major surface of a light-transmitting substrate;
   forming a first film in a first region over the substrate and the first conductive layer;
   forming a photocatalytic film in at least a part of the first region over the first film;
   heating the photocatalytic film in vacuum;
   changing wettability of the first film in a second region which is in the first region, being in contact with the photocatalytic film, and not overlapping the mask, by light irradiation from a back surface opposite to the major surface of the substrate;
   removing the photocatalytic film; and
   discharging a composition including a pattern forming material in the second region so as to form a source and drain electrode.

26. The method for forming the thin film transistor according to claim 25, wherein wettability with respect to the composition of the second region is higher than that of the first region.

27. The method for forming the thin film transistor according to claim 25, wherein the photocatalytic film comprises zinc oxide.

28. The method for forming the thin film transistor according to claim 25, wherein the first film comprises alkylsilane or fluoroalkylsilane.

29. The method for forming the thin film transistor according to claim 25, wherein the light has a wavelength of 380 nm or less.

30. The method for forming the thin film transistor according to claim 25, wherein the first conductive layer is a gate electrode layer.

31. A method for forming an electronic appliance including the thin film transistor according to claim 25, further comprising a step of incorporating the thin film transistor into the electronic appliance.

32. The method for forming the electronic appliance according to claim 31, wherein the electronic appliance is anyone of a video camera, a digital camera, a projector, a head mounted display, a car navigation system, a car stereo, a personal computer, a game machine, a portable information terminal, or an image reproducing device provided with a recording medium.

* * * * *